(12) United States Patent
Nakatani

(10) Patent No.: US 9,520,505 B2
(45) Date of Patent: Dec. 13, 2016

(54) CAPACITANCE TYPE MEMS SENSOR

(75) Inventor: Goro Nakatani, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 916 days.

(21) Appl. No.: 13/359,490

(22) Filed: Jan. 26, 2012

(65) Prior Publication Data

US 2012/0193733 A1 Aug. 2, 2012

(30) Foreign Application Priority Data

Jan. 27, 2011 (JP) .................. 2011-015730

(51) Int. Cl.
*H01L 29/84* (2006.01)
*B81B 3/00* (2006.01)
*H04R 19/00* (2006.01)

(52) U.S. Cl.
CPC ............. *H01L 29/84* (2013.01); *B81B 3/0021* (2013.01); *B81B 2201/0257* (2013.01); *B81B 2201/0292* (2013.01); *B81B 2203/0109* (2013.01); *B81B 2203/04* (2013.01); *B81B 2203/051* (2013.01); *H04R 19/005* (2013.01)

(58) Field of Classification Search
CPC ............... H01L 27/14856; H01L 29/84; B81B 2201/0257; B81B 2201/0292; B81B 2203/0109; B81B 2203/04; B81B 2203/051; B81B 3/0021; H04R 19/005
USPC ........................................................ 257/225
See application file for complete search history.

(56) References Cited

U.S. PATENT DOCUMENTS

| 6,621,134 B1* | 9/2003 | Zurn ........................... 257/415 |
| 2010/0119097 A1* | 5/2010 | Ohtsuka ...................... 381/361 |
| 2010/0194407 A1* | 8/2010 | Nakatani ............... G01P 15/125 324/660 |
| 2010/0320873 A1* | 12/2010 | Fujita .................... B81B 3/0086 310/348 |
| 2011/0115038 A1* | 5/2011 | Kanemoto ................. 257/418 |

FOREIGN PATENT DOCUMENTS

JP 3451593 7/2003

* cited by examiner

*Primary Examiner* — A. Sefer
*Assistant Examiner* — Benjamin Tzu-Hung Liu
(74) *Attorney, Agent, or Firm* — Rabin & Berdo, P.C.

(57) ABSTRACT

A capacitance type MEMS sensor has a first electrode portion and a second electrode portion facing each other. The sensor includes a semiconductor substrate having a recess dug in a thickness direction of the semiconductor substrate, the recess having sidewalls, one of which serves as the first electrode portion. The sensor further includes a diaphragm serving as the second electrode portion, the diaphragm arranged within the recess to face the first electrode portion in a posture extending along a depth direction of the recess, the diaphragm having a lower edge spaced apart from the bottom surface of the recess, and is made of the same material as the semiconductor substrate. The sensor further includes an insulating film arranged to join the diaphragm to the semiconductor substrate.

10 Claims, 26 Drawing Sheets

CAPACITANCE TYPE MEMS SENSOR

CROSS-REFERENCE TO RELATED APPLICATION

This application is based upon and claims the benefit of priority from Japanese Patent Application No. 2011-015730, filed on Jan. 27, 2011, the entire contents of which are incorporated herein by reference.

TECHNICAL FIELD

The present disclosure relates to a capacitance type MEMS sensor.

BACKGROUND

Sensors manufactured by MEMS (micro-electro-mechanical systems) technology are used in, e.g., microphones and so forth. A microphone manufactured by MEMS technology is disclosed in the related art. This microphone includes a back plate as a fixed electrode, a diaphragm as a movable electrode, and a unit for keeping the diaphragm held to the back plate. The back plate has a plurality of holes. In the related art, there is known a structure in which the back plate united with a silicon wafer is formed by etching the silicon wafer. A cavity is formed at the rear surface side of the silicon wafer with respect to the back plate. A spacing is formed at the front surface side of the silicon wafer with respect to the back plate. A diaphragm made of silicon nitride is arranged on the front surface of the silicon wafer to face the back plate across the spacing. A metal layer is formed on the front surface of the diaphragm. If a sound wave is inputted, the diaphragm vibrates to thereby change the capacitance between the metal layer on the front surface of the diaphragm and the back plate. Thus, the sound wave can be converted to an electric signal.

A method for forming the diaphragm includes a step of forming a polysilicon film as a sacrificing layer on the front surface of the silicon wafer, a step of forming a silicon nitride film (diaphragm) on the polysilicon film, and a step of etching and removing the polysilicon film as the sacrificing layer to release restraint of the diaphragm.

In order to enhance the sensitivity of a capacitance type sensor, it is desirable to increase the area (the mutually-facing area) of a movable electrode and a fixed electrode. In the related art, however, the device size grows larger as the area of the electrodes is increased. This leads to a decrease in the number of sensors, e.g., microphones, which can be manufactured from a single silicon wafer. Accordingly, the manufacturing cost of sensors increases.

In the related art, it is unavoidable to form a polysilicon layer as a sacrificing layer in order to support the diaphragm in a movable state. While the polysilicon layer is conventionally removed through the use of a "wet etching agent," the present inventor has found through inspection that, in the wet etching process, the diaphragm adheres to the surface of the silicon wafer by the surface tension of an etching liquid. Therefore, in reality, the removal of the polysilicon layer as a sacrificing layer needs to be performed by gas-phase etching through the use of hydrofluoric acid vapor. However, gas-phase etching is a costly process, becoming an obstacle in reducing the manufacturing cost.

SUMMARY

The present disclosure provides some embodiments of a capacitance type MEMS sensor which is highly sensitive, small in size and capable of reducing the manufacturing cost.

According to one aspect of the present disclosure, there is provided a capacitance type MEMS sensor having a first electrode portion and a second electrode portion facing each other. The capacitance type MEMS sensor includes a semiconductor substrate, a diaphragm and an insulating film. The semiconductor substrate has a recess, which is dug in a thickness direction of the semiconductor substrate. The recess has sidewalls, one of which serves as the first electrode portion. The diaphragm serves as the second electrode portion and is arranged within the recess to face the first electrode portion in a posture extending along a depth direction of the recess. The diaphragm has a lower edge spaced apart from a bottom surface of the recess and is made of the same material as the semiconductor substrate. The insulating film is arranged to join the diaphragm to the semiconductor substrate.

The term "thickness direction" of the semiconductor substrate refers to the direction orthogonal to the major surfaces of the semiconductor substrate (namely, the direction normal to the major surfaces). With the configuration noted above, the diaphragm as the second electrode portion arranged within the recess of the semiconductor substrate is joined to the semiconductor substrate by the insulating film where the lower edge of diaphragm is in a state of floating from the bottom surface of the recess. This enables the diaphragm to freely vibrate or expand and contract. In the capacitance type MEMS sensor according to the one aspect of the present disclosure, therefore, the diaphragm becomes a movable electrode and the sidewall as the first electrode portion becomes a fixed electrode. In response to a vibration or expansion and contraction of the diaphragm, the capacitance between the diaphragm and the sidewall is changed. Accordingly, if the diaphragm is vibrated by sound waves, it is possible to convert the sound waves to electric signals. Further, if the diaphragm is expanded and contracted by the change in temperature or humidity, it is possible to convert the change in temperature or humidity to an electric signal.

The second electrode portion has a thickness extending parallel to the major surfaces of the semiconductor substrate and a pair of major surfaces extending in the direction normal to the major surfaces of the semiconductor substrate. The second electrode portion is arranged within the recess in such a posture as to extend in the depth direction of the recess. Therefore, if the semiconductor substrate is kept horizontal, the second electrode portion extends substantially vertically. This eliminates the possibility that the second electrode portion is bent under the influence of gravity and adheres to the inner surface of the recess. Accordingly, the second electrode portion can be made thinner without considering the influence of gravity. This enables the second electrode portion to vibrate or expand and contract in response to a small change in sound wave, temperature or humidity. In other words, it is possible to enhance the sensitivity of the capacitance type MEMS sensor. If the recess is made deeper, the second electrode portion can be enlarged in the depth direction of the recess, thereby increasing the facing area of the first electrode portion and the second electrode portion. This also makes it possible to enhance the sensitivity of the capacitance type MEMS sensor.

Even if the second electrode portion is made larger in the depth direction of the recess, the size of the capacitance type MEMS sensor seen in the thickness direction of the semiconductor substrate may remain unchanged. Therefore, despite an increase in the size of the second electrode portion, the capacitance type MEMS sensor can be configured to have a small size in the thickness direction of the semiconductor substrate. This makes it possible to increase the number of capacitance type MEMS sensors that can be manufactured from a single parent substrate (semiconductor wafer), eventually reducing the manufacturing cost of the capacitance type MEMS sensor.

The first electrode portion and the second electrode portion are both made of the same material as the semiconductor substrate. The capacitance type MEMS sensor can be manufactured by digging the recess in the thickness direction of the semiconductor substrate so that the second electrode portion can be arranged within the recess and spacing the lower end of the second electrode portion apart from the bottom surface of the recess. Therefore, when manufacturing the capacitance type MEMS sensor, there is no need to perform a step of forming a sacrificing layer between the first electrode portion and the second electrode portion and a step of removing the sacrificing layer to movably support the second electrode portion. This also makes it possible to reduce the manufacturing cost of the capacitance type MEMS sensor.

As a result, it is possible to provide a capacitance type MEMS sensor which is highly sensitive, small in size and capable of reducing the manufacturing cost. The insulating film may be arranged to join at least one lateral edge of the diaphragm to one of the sidewalls other than the sidewall serving as the first electrode portion of the recess. With this configuration, the diaphragm can readily vibrate or expand and contract one lateral edge thereof as the base end portion, which is joined to the sidewall.

The recess may have an internal space and the diaphragm may be arranged to divide the internal space of the recess into a first space positioned at the side of the first electrode portion and a second space positioned at the opposite side from the first electrode portion. The capacitance type MEMS sensor may further include a cover arranged on the semiconductor substrate to cover at least the first space. With this configuration, the first space is isolated from the outside of the recess by the cover. It is therefore possible to prevent external foreign materials from infiltrating into the first space between the first electrode portion and the second electrode portion (the diaphragm) and consequently reducing the sensitivity of the capacitance type MEMS sensor.

The capacitance type MEMS sensor may also include a cover arranged on the semiconductor substrate to cover the first space and the second space, and a bonding agent arranged to join the cover to the semiconductor substrate while leaving an opening through which the second space communicates with a space outside the recess. With this configuration, the first space is isolated from the outside of the recess by the cover. It is therefore possible to prevent external foreign materials from infiltrating into the first space between the first electrode portion and the second electrode portion (the diaphragm) and consequently reducing the sensitivity of the capacitance type MEMS sensor. The second space becomes an echo chamber that communicates with an external space of the recess through the opening. Thus, sound waves enter the second space through the opening and echo within the second space, in response to which the second electrode portion vibrates. This makes it possible to convert the sound waves to electric signals. Since the opening is formed at the same time the cover is bonded to the semiconductor substrate by the bonding agent, it is possible to omit the step of separately forming the opening. This makes it possible to reduce the manufacturing cost of the capacitance type MEMS sensor.

The capacitance type MEMS sensor may also include a cover arranged on the semiconductor substrate to cover the first space and the second space. The cover may have an opening through which the second space communicates with a space outside the recess. With this configuration, the first space is isolated from the outside of the recess by the cover. It is therefore possible to prevent external foreign materials from infiltrating into the first space between the first electrode portion and the second electrode portion (the diaphragm) and consequently reducing the sensitivity of the capacitance type MEMS sensor. The second space becomes an echo chamber that communicates with an external space of the recess through the opening, which is formed in the cover. Thus, sound waves enter the second space through the opening and echo within the second space, in response to which the second electrode portion vibrates. This makes it possible to convert the sound waves to electric signals.

The capacitance type MEMS sensor may include a projection protruding toward the first electrode portion from a surface of the diaphragm facing the first electrode portion. With this configuration, the projection serves as a stabilizer for the diaphragm and makes contact with the first electrode portion, thereby attenuating the vibration of the diaphragm. The diaphragm may include an irregularity formed on a surface thereof facing the first electrode portion. With this configuration, as the area of the surface of the diaphragm is increased, the facing area of the diaphragm (the second electrode portion) and the first electrode portion grows larger while the spacing between the diaphragm and the first electrode portion becomes narrower due to the existence of the prominent portion of the irregularity formed on the surface of the diaphragm. This makes it possible to increase the capacitance between the diaphragm and the first electrode portion. It is therefore possible to enhance the sensitivity of the capacitance type MEMS sensor. In addition, the prominent portion of the diaphragm serves as a stabilizer for the diaphragm and makes contact with the first electrode portion, thereby attenuating the vibration of the diaphragm.

The first electrode portion may include an irregularity formed on a surface thereof. With this configuration, as the area of the surface of the first electrode portion is increased, the facing area of the diaphragm (the second electrode portion) and the first electrode portion grows larger while the spacing between the diaphragm and the first electrode portion becomes narrower due to the existence of the prominent portion of the irregularity formed on the surface of the first electrode portion. This makes it possible to increase the capacitance between the diaphragm and the first electrode portion. It is therefore possible to enhance the sensitivity of the capacitance type MEMS sensor. In addition, the prominent portion of the first electrode portion serves as a stabilizer for the diaphragm and makes contact with the diaphragm, thereby attenuating the vibration of the diaphragm. If an irregularity is also formed on the surface of the diaphragm facing the first electrode portion, it is possible to further enhance the effects stated above.

The diaphragm may include a prominent portion and a depressed portion formed on a surface thereof facing the first electrode portion, and the first electrode portion may include a prominent portion and a depressed portion formed on a surface thereof facing the diaphragm. Further, the prominent portion of the diaphragm may be inserted into the depressed portion of the first electrode portion, and the prominent portion of the first electrode portion may be inserted into the depressed portion of the diaphragm. With this configuration, the facing area of the diaphragm (the second electrode portion) and the first electrode portion grows larger. This makes it possible to increase the capacitance between the diaphragm and the first electrode portion. It is therefore possible to enhance the sensitivity of the capacitance type MEMS sensor.

The capacitance type MEMS sensor may further include an integrated circuit element formed in the semiconductor substrate. With this configuration, it is possible to form the capacitance type MEMS sensor and the integrated circuit element into a single chip. The capacitance type MEMS sensor may be a capacitance type microphone that uses the diaphragm as a vibrating plate. With this configuration, it is possible to provide a capacitance type microphone which is highly sensitive, small in size and capable of reducing the manufacturing cost.

DETAILED DESCRIPTION

Figure 1:
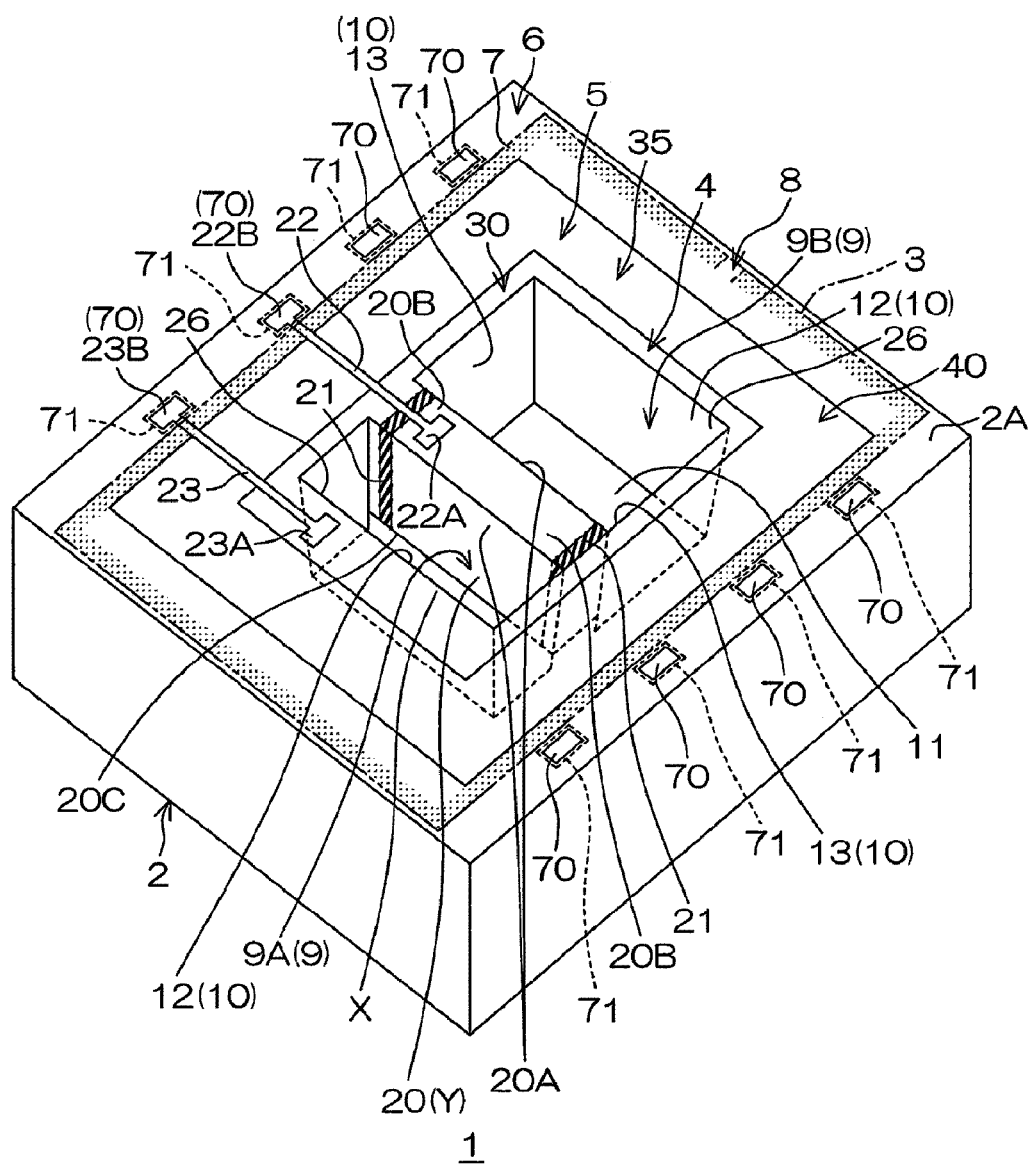
FIG. 1 is a schematic perspective view showing a capacitance type microphone according to one embodiment of the present disclosure.
Figure 2:
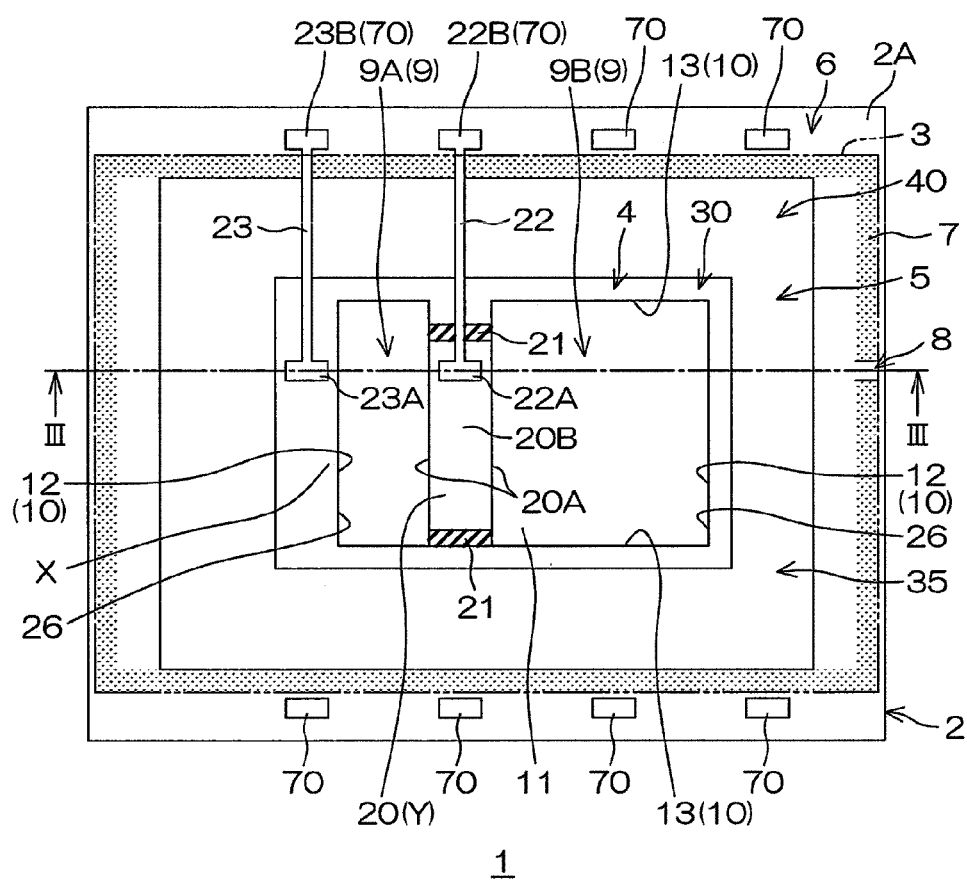
FIG. 2 is a schematic plan view of the capacitance type microphone.

An embodiment of the present disclosure will now be described in detail with reference to the accompanying drawings. Specifically, a capacitance type microphone will be illustrated and described as one example the capacitance type MEMS sensor of the present invention. FIG. 1 is a schematic perspective view showing a capacitance type microphone according to the embodiment of the present invention. FIG. 2 is a schematic plan view of the capacitance type microphone.

Referring to FIGS. 1 and 2, a microphone 1 is formed in a chip having a quadrangular plan-view shape. The microphone 1 includes a semiconductor substrate 2 and a cover 3. The semiconductor substrate 2 is made of Si (silicon) having a low resistance of, e.g., 5 mΩ to 25 mΩ, and has a predetermined thickness. The term "thickness direction" of the semiconductor substrate 2 used herein means the direction orthogonal to the front surface 2A, i.e., one major surface, of the semiconductor substrate 2 (namely, the direction normal to the front surface 2A).

In a plan view seen in the thickness direction of the semiconductor substrate 2, a microphone region 4, an integrated circuit region 5 surrounding the microphone region 4 and a terminal region 6 surrounding the integrated circuit region 5 are defined in the semiconductor substrate 2. The integrated circuit region 5 and the terminal region 6 are formed in a frame-like shape. The cover 3 is made of, e.g., Si, and is arranged on the semiconductor substrate 2. The cover 3 fully covers the microphone region 4 and the integrated circuit region 5 on the front surface 2A of the semiconductor substrate 2. The outer peripheral edge portion of the cover 3, i.e., over the entire perimeter thereof, protrudes onto the terminal region 6 outside the integrated circuit region 5. A bonding agent 7 (depicted by dots) is applied on the surface of the outer peripheral edge portion of the cover 3 facing the front surface 2A of the semiconductor substrate 2 in the terminal region 6.

The bonding agent 7 is, e.g., a glass frit containing lead, and is applied on the outer peripheral edge portion of the cover 3 by screen printing. The bonding agent 7 is not provided over the entire perimeter of the outer peripheral edge portion of the cover 3. In other words, the bonding agent 7 is not provided at one circumferential point on the outer peripheral edge portion of the cover 3. Therefore, the bonding agent 7 in its entirety has a substantially C-like shape extending along substantially the entire perimeter of the outer peripheral edge portion of the cover 3. The bonding agent 7 is also applied on the front surface 2A of the semiconductor substrate 2 in the terminal region 6 to substantially surround the integrated circuit region 5 when seen in a plan view. Thus, the cover 3 and the semiconductor substrate 2 are bonded together.

Since the bonding agent 7 is not provided at one circumferential point on the outer peripheral edge portion of the cover 3, a spacing exists between the outer peripheral edge portion of the cover 3 and the front surface 2A of the semiconductor substrate 2 at one circumferential point. The spacing is referred to as an opening 8. The space formed between the cover 3 and the front surface 2A of the semiconductor substrate 2 and surrounded by the bonding agent 7 is brought into communication with the outside of the microphone 1 through the opening 8.

The configurations of the microphone 1 in the microphone region 4, the integrated circuit region 5 and the terminal region 6 will now be described separately.

<Configuration in Microphone Region>

In the microphone region 4, there is formed a recess 9 dug in the thickness direction of the semiconductor substrate 2 from the front surface 2A of the semiconductor substrate 2 to a thickness-wise intermediate position of the semiconductor substrate 2. The recess 9 as a whole is formed into, e.g., a rectangular parallelepiped shape having a substantially rectangular plan-view cross section. The depth of the recess 9 is, e.g., 500 µm. The recess 9 communicates with the space existing between the cover 3 and the front surface 2A of the semiconductor substrate 2. The recess 9 communicates with the outside of the microphone 1 (namely, the external space of the recess 9) through the opening 8 that also brings the aforementioned space into communication with the outside of the microphone 1.

Figure 3:
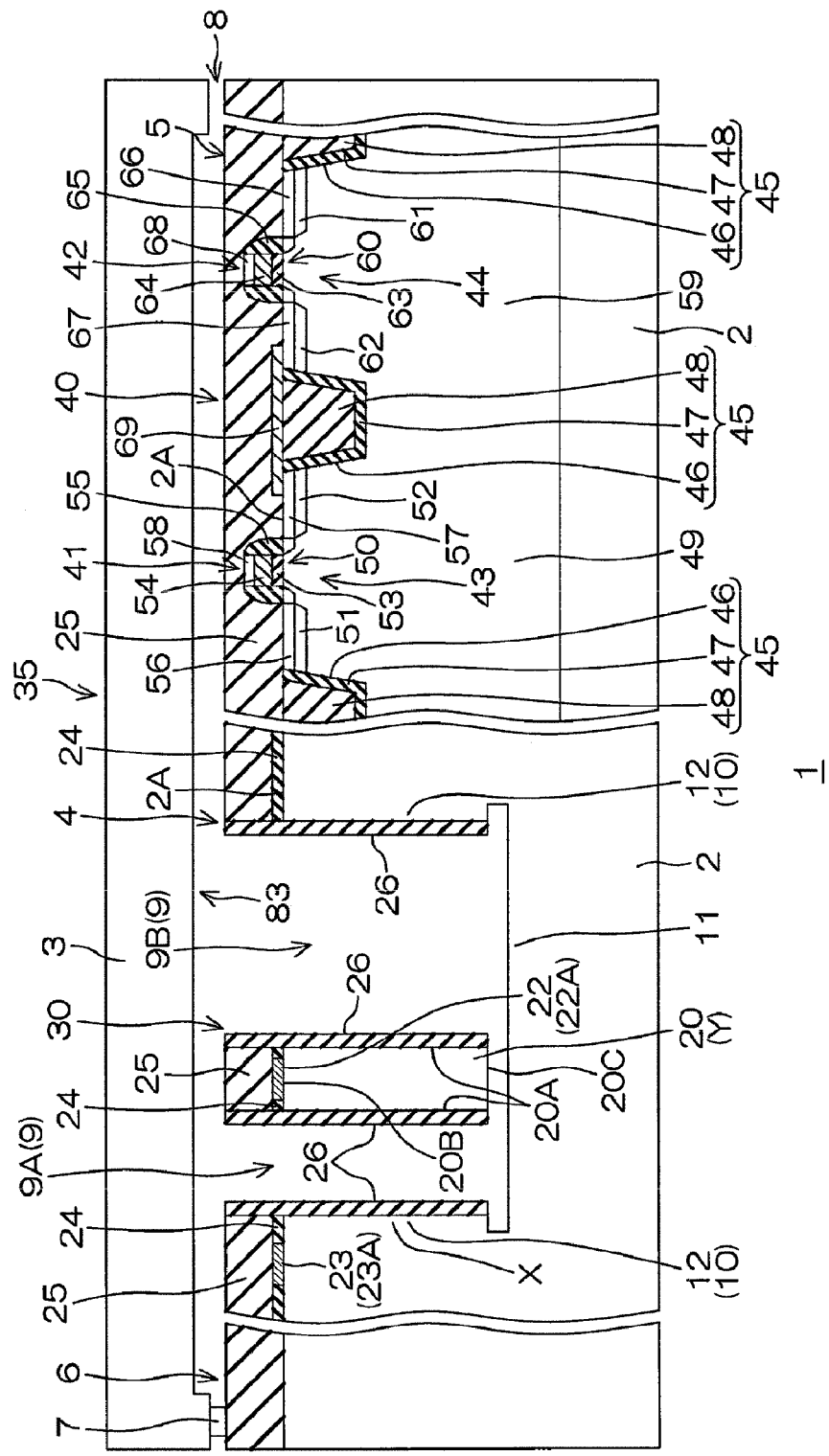
FIG. 3 is a schematic section view taken along section line III-III in FIG. 2.

In the microphone region 4, the portion of the semiconductor substrate 2 defining the inner surface of the recess 9 (excluding the bottom surface) will be referred to as a sidewall 10. The portion of the semiconductor substrate 2 defining the bottom surface of the recess 9 will be referred to as a bottom wall 11. The sidewall 10 includes a pair of sidewall portions 12 opposing to each other in the longitudinal direction of the recess 9 when seen in a plan view and a pair of sidewall portions 13 opposing to each other in the transverse direction of the recess 9 when seen in a plan view. FIG. 3 is a schematic section view taken along section line III-III in FIG. 2.

Referring to FIG. 3, the microphone 1 includes a diaphragm 20, insulating films 21 (see FIGS. 1 and 2), a first wiring layer 22, a second wiring layer 23, an insulating layer 24, a passivation layer 25 and insulating members 26, all of which are arranged in the microphone region 4. These components and the recess 9 make up a microphone element 30 in the microphone region 4. The diaphragm 20 is a thin film made of the same material as the semiconductor substrate 2 (Si, in the present embodiment) and has flexibility. The thickness of the diaphragm 20 is, e.g., 1 µm. The diaphragm 20 is arranged within the recess 9 in such a posture as to extend in the depth direction of the recess 9.

When seen in a plan view, the thickness direction of the diaphragm 20 coincides with the direction parallel to the front surface 2A of the semiconductor substrate 2, namely the longitudinal direction of the recess 9 (see FIG. 2). In the diaphragm 20, a pair of surfaces extending in the direction orthogonal to the thickness direction of the diaphragm 20 (namely, the left and right surfaces in FIG. 3) is called major surfaces 20A. The upper surface of the diaphragm 20 in FIG. 3 is called a top surface 20B. The lower surface of the diaphragm in FIG. 3 is called a bottom surface 20C. The top surface 20B is flush with the front surface 2A of the semiconductor substrate 2. The bottom surface 20C is the lower edge of the diaphragm 20 and is spaced apart from the bottom surface (the bottom wall 11) of the recess 9 toward the top surface 20B.

The diaphragm 20 is installed between the sidewall portions 13 opposing to each other in the transverse direction of the recess 9 when seen in a plan view. The diaphragm 20 extends in the transverse direction of the recess 9 when seen in a plan view (see FIG. 2). The left sidewall portion 12 in FIG. 3, one of the pair of sidewall portions 12 opposing to each other in the longitudinal direction of the recess 9, is called a first electrode portion X. The diaphragm 20 is arranged within the recess 9 in a position off-centered toward the first electrode portion X. Thus, the internal space of the recess 9 is divided by the diaphragm 20 into a first space 9A existing at the side of the first electrode portion X and a second space 9B existing at the opposite side of the diaphragm 20 from the first electrode portion X. Since the bottom surface 20C of the diaphragm 20 is spaced apart from the bottom surface of the recess 9, the first space 9A and the second space 9B communicate with each other through the spacing between the bottom surface 20C of the diaphragm 20 and the bottom surface of the recess 9.

Although the first electrode portion X is provided in one of the sidewall portions 12, no first electrode portion is provided in the pair of sidewall portions 13. The cover 3 set forth above covers the first space 9A and the second space 9B from the front surface 2A of the semiconductor substrate 2. The opening 8 is formed nearer to the second space 9B than the first space 9A. The opening 8 brings the second space 9B into communication with the outside of the microphone 1.

As opposed to the first electrode portion X, the diaphragm 20 is sometimes called a second electrode portion Y. In the diaphragm 20 (the second electrode portion Y), the major surface 20A existing at the side of the first electrode portion X faces the first electrode portion X across the first space 9A. The insulating films 21 shown in FIG. 1 are made of, e.g., SiO₂ (silicon oxide). The insulating films 21 are provided at the longitudinal opposite sides of the diaphragm 20. On the basis of the posture shown in FIG. 1, the right insulating film 21 is interposed between the sidewall portion 13 near the right insulating film 21 and the diaphragm 20, thereby joining the right edge of the diaphragm 20 to the corresponding sidewall portion 13. Further, on the basis of the posture shown in FIG. 1, the left insulating film 21 is provided at a position spaced apart from the end edge (left end edge) of the diaphragm 20 near the left insulating film 21 toward the right side. Therefore, in the diaphragm 20 installed between the sidewall portions 13, the portion of the diaphragm 20 interposed between the insulating films 21 is structurally joined to the pair of sidewall portions 13 (the semiconductor substrate 2) and is electronically isolated and insulated from the pair of sidewall portions 13 by the insulating films 21.

The first wiring layer 22 is made of, e.g., Al (aluminum). The first wiring layer 22 is formed to straddle the top surface 20B of the diaphragm 20 and the front surface 2A of the silicon substrate 2. The first wiring layer 22 is provided with a first end portion 22A and a second end portion 22B and is formed to interconnect the first end portion 22A and the second end portion 22B. The first end portion 22A is provided on the region of the top surface 20B of the diaphragm 20 interposed between the right and left insulating films 21. The second end portion 22B, which serves as a connecting terminal 70, is provided on the front surface 2A of the semiconductor substrate 2 in the terminal region 6 existing at the leftmost side in FIG. 1. The first wiring layer 22 straddles over the left insulating film 21 in FIG. 1.

The second wiring layer 23 is made of the same material as that of the first wiring layer 22. The second wiring layer 23 is formed on the front surface 2A of the semiconductor substrate 2. The second wiring layer 23 is provided with a first end portion 23A and a second end portion 23B and is formed to interconnect the first end portion 23A and the second end portion 23B. The first end portion 23A is arranged in the region of the front surface 2A of the semiconductor substrate 2 coinciding with the first electrode portion X. The second end portion 23B, which serves as a connecting terminal 70, is provided on the front surface 2A of the semiconductor substrate 2 in the terminal region 6 existing at the leftmost side in FIG. 1.

Referring to FIG. 3, the insulating layer 24 is made of, e.g., $SiO_2$. The insulating layer 24 is formed on the front surface 2A of the semiconductor substrate 2 and the top surface 20B of the diaphragm 20 in the entire microphone region 4 excluding the region in which the first wiring layer 22 and the second wiring layer 23 are formed. The passivation layer 25 is made of, e.g., $SiO_2$. The passivation layer 25 is deposited on the first wiring layer 22, the second wiring layer 23 and the insulating layer 24.

The insulating members 26 are made of, e.g., $SiO_2$. The insulating members 26 are formed in the entire region of the inner surface (excluding the bottom surface) of the recess 9 and in the entire region of the pair of major surfaces 20A of the diaphragm 20. The insulating members 26 are also formed in the entire region of the end surfaces of the insulating layer 24 and the passivation layer 25 meeting with the inner surface of the recess 9 and the major surfaces 20A. For the sake of convenience in description, the insulating layer 24 and the passivation layer 25 are not shown in FIGS. 1 and 2.

If a bias voltage is applied to the first wiring layer 22 and the second wiring layer 23, the electric potential difference between the first electrode portion X and the second electrode portion Y remains constant. If sound waves (sound pressure) are inputted to the microphone 1 in this state, the sound waves enter the second space 9B of the recess 9 from the opening 8 and echo in the second space 9B. In response, the second electrode portion Y vibrates as a vibration plate. Thus, the spacing between the first electrode portion X and the second electrode portion Y is changed and the capacitance between the first electrode portion X and the second electrode portion Y is changed. The microphone element 30 can detect the sound wave based on the change in the capacitance.

<Configuration in Integrated Circuit Region>

An integrated circuit element 40 is formed in the integrated circuit region 5. In other words, the microphone element 30 and the integrated circuit element 40 are formed in the semiconductor substrate 2. This makes it possible to configure the microphone element 30 and the integrated circuit element 40 into a single chip.

The integrated circuit element 40 includes a CMOS (Complementary Metal Oxide Semiconductor) device. More specifically, the integrated circuit element 40 includes an n-channel MOSFET (Negative-Channel Metal Oxide Semiconductor Field Effect Transistor) 41 and a p-channel MOSFET (Positive-Channel Metal Oxide Semiconductor Field Effect Transistor) 42 formed on the semiconductor substrate 2. The integrated circuit element 40 can be used to process signals depending on the amount of change of the capacitance in the microphone element 30.

In the semiconductor substrate 2, an n-MOS region 43 in which the n-channel MOSFET 41 is formed and a p-MOS region 44 in which the p-channel MOSFET 42 is formed are isolated and insulated from the surrounding elements by an element isolating portion 45. The element isolating portion 45 is formed by forming a trench (shallow trench 46) dug down from the front surface 2A of the semiconductor substrate 2 with a relatively shallow depth, forming a thermal oxide film 47 on the inner surface of the shallow trench 46 by a thermal oxidation method and then depositing an insulating body 48 (e.g., $SiO_2$) within the shallow trench 46 by a CVD (Chemical Vapor Deposition) method.

A p-type well 49 is formed in the n-MOS region 43. The depth of the p-type well 49 is greater than the depth of the shallow trench 46. An n-type source region 51 and an n-type drain region 52 are formed in a surface layer portion of the p-type well 49 with a channel region 50 interposed therebetween. The depth and the impurity concentration are low in the end portions of the source region 51 and the drain region 52 positioned near the channel region 50. That is, an LDD (Lightly Doped Drain) structure is employed in the n-channel MOSFET 41.

A gate insulating film 53 is provided on the channel region 50. The gate insulating film 53 is formed in the same layer as the insulating layer 24 stated above. A gate electrode 54 is provided on the gate insulating film 53. The gate electrode 54 is made of n-type polysilicon (polycrystalline silicon). A sidewall 55 is formed around the gate insulating film 53 and the gate electrode 54. The sidewall 55 is made of SiN (silicon nitride).

Silicide layers 56 through 58 are formed on the source region 51, the drain region 52 and the surface of the gate electrode 54 respectively. An n-type well 59 is formed in the p-MOS region 44. The depth of the n-type well 59 is greater than the depth of the shallow trench 46. A p-type source region 61 and a p-type drain region 62 are formed in a surface layer portion of the n-type well 59 with a channel region 60 interposed therebetween. The depth and the impurity concentration are low in the end portions of the source region 61 and the drain region 62 positioned near the channel region 60. That is, an LDD structure is employed in the p-channel MOSFET 42.

A gate insulating film 63 is provided on the channel region 60. The gate insulating film 63 is made of $SiO_2$. A gate electrode 64 is provided on the gate insulating film 63. The gate electrode 64 is made of p-type polysilicon. A sidewall 65 is formed around the gate insulating film 63 and the gate electrode 64. The sidewall 65 is made of silicon nitride.

Silicide layers 66 through 68 are formed on the source region 61, the drain region 62 and the surface of the gate electrode 64 respectively. A third wiring layer 69 is formed on the front surface 2A of the semiconductor substrate 2. The third wiring layer 69 is made of the same material as that of the first wiring layer 22 and the second wiring layer 23 and is formed in the same layer as the first wiring layer 22 and the second wiring layer 23. The third wiring layer 69 is formed to straddle adjoining drain regions 52 and 62 of the n-channel MOSFET 41 and the p-channel MOSFET 42, respectively. The third wiring layer 69 electrically interconnects the drain regions 52 and 62.

Although not shown in the drawings, wiring layers joined to the source regions 51 and 61 and the gate electrodes 54 and 64 are formed in the integrated circuit region 5. Some portions of these wiring layers and the third wiring layer 69 are arranged in the terminal region 6 as connecting terminals 70 (see FIG. 1). The passivation layer 25 set forth above is deposited on the front surface 2A of the semiconductor substrate 2. In the integrated circuit region 5, the passivation layer 25 covers the front surface 2A of the semiconductor substrate 2, the sidewalls 55 and 65 around the gate electrodes 54 and 64, respectively, the silicide layers 58 and 68, and the third wiring layer 69.

<Configuration in the Terminal Region>

Referring to FIG. 1, the connecting terminals 70 stated above are arranged in the terminal region 6. In FIG. 1, two sets of connecting terminals 70, each including four connecting terminals 70 arranged side by side and evenly spaced-apart, are provided with the microphone region 4 and the integrated circuit region 5 interposed therebetween.

As in the microphone region 4 and the integrated circuit region 5, a passivation layer 25 (see FIG. 3) is deposited on the front surface 2A of the semiconductor substrate 2 in the terminal region 6. Openings 71 through which to expose the connecting terminals 70 as pads are formed in the passivation layer 25 of the terminal region 6. The connecting terminals 70 exposed as pads are electrically connected to external electrode pads (not shown) by, e.g., bonding wires (not shown).

<Manufacturing Method of Microphone>

FIGS. 4 through 17 are views illustrating different steps of manufacturing a microphone.

Figure 4A:
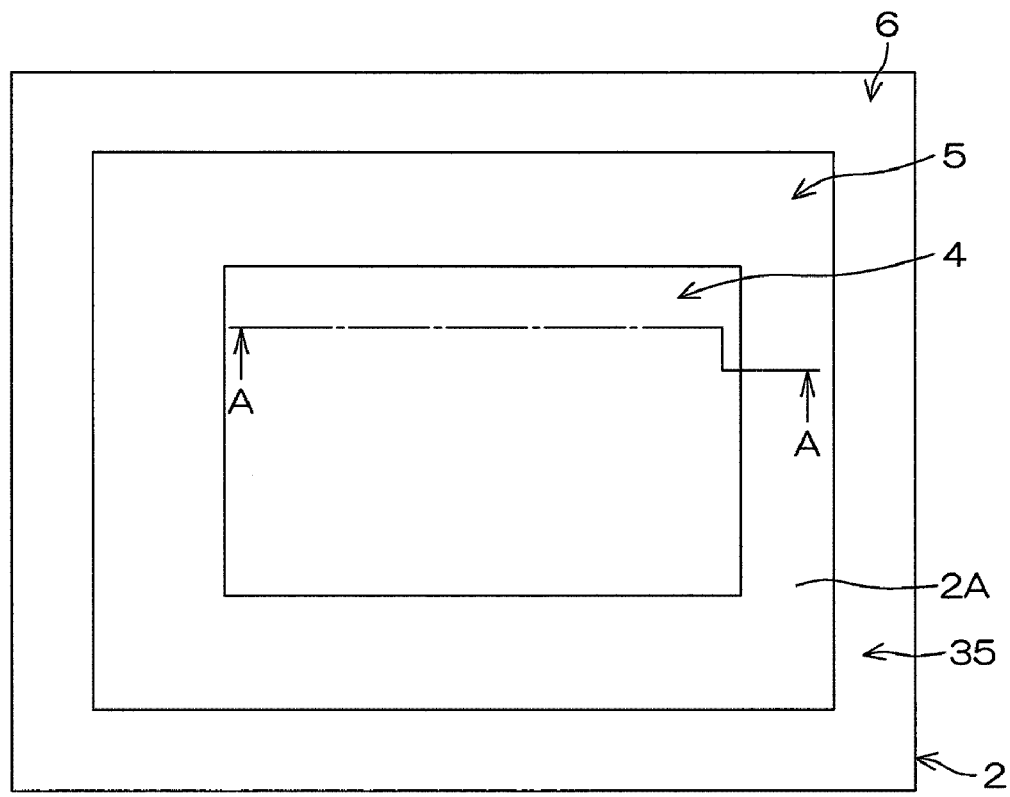
FIG. 4A is a schematic plan view illustrating a manufacturing step of the capacitance type microphone shown in FIGS. 1 through 3.

Next, steps of manufacturing the microphone 1 set forth above will be described in the sequential order of steps with reference to FIGS. 4 through 17. First, as shown in FIG. 4, a semiconductor substrate 2 is manufactured by a well-known method. The semiconductor substrate 2 is a silicon disc having a predetermined thickness (see FIG. 16). A plurality of microphones 1 is collectively formed on one semiconductor substrate (silicon wafer) 2. FIG. 4A is an schematic plan view showing a region of the semiconductor substrate 2 in which one microphone 1 is formed. This region is called a microphone forming region 35. A plurality of microphone forming regions 35 is provided in the semiconductor substrate 2 and is arranged in a predetermined arrangement pattern (see FIG. 16). One microphone 1 is formed in each of the microphone forming regions 35.

Figure 4B:
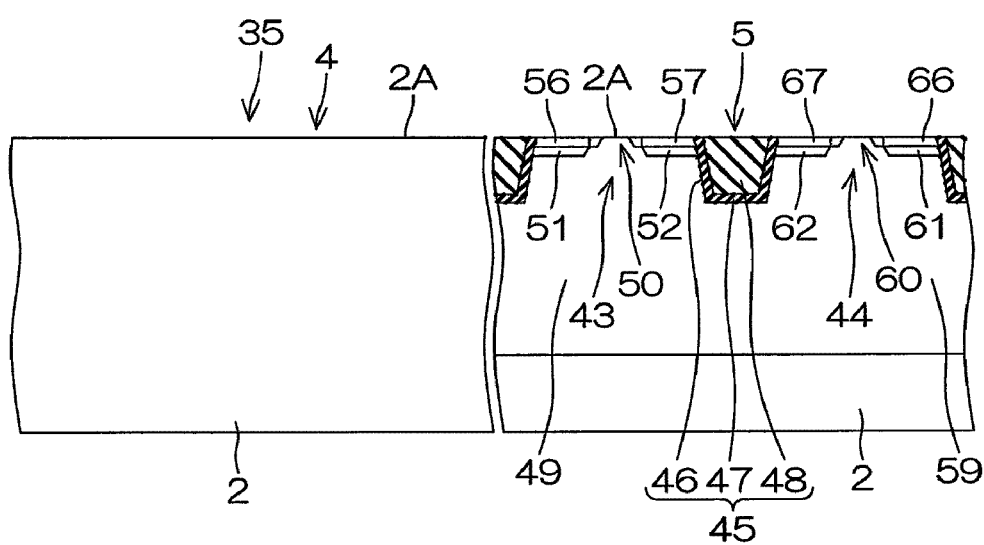
FIG. 4B is a schematic section view taken along section line A-A in FIG. 4A.

Then, as shown in FIG. 4B, a portion of the n-channel MOSFET 41 and a portion of the p-channel MOSFET 42 are formed in the semiconductor substrate 2 of the integrated circuit region 5 by a well-known CMOS technology. In FIG. 4B, an element isolating portion 45, a p-type well 49, an n-type well 59, channel regions 50 and 60, source regions 51 and 61, drain regions 52 and 62, and silicide layers 56, 57, 66 and 67 are formed in the semiconductor substrate 2 of the integrated circuit region 5.

Figure 5A:
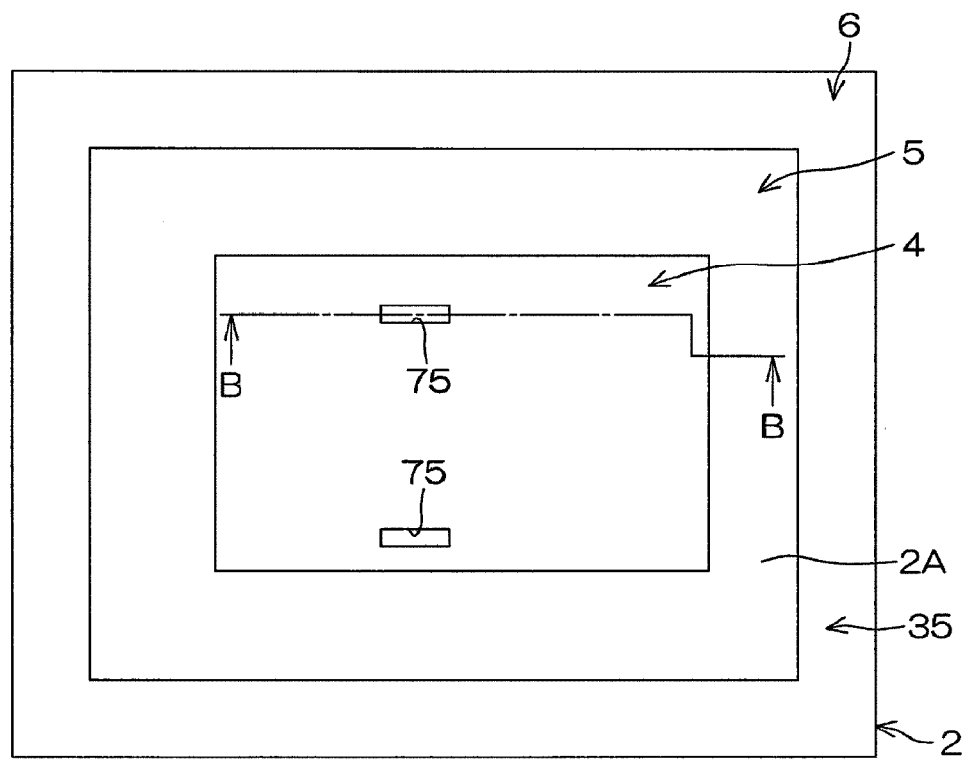
FIG. 5A is a schematic plan view illustrating the next step after the step illustrated in FIG. 4A.
Figure 5B:
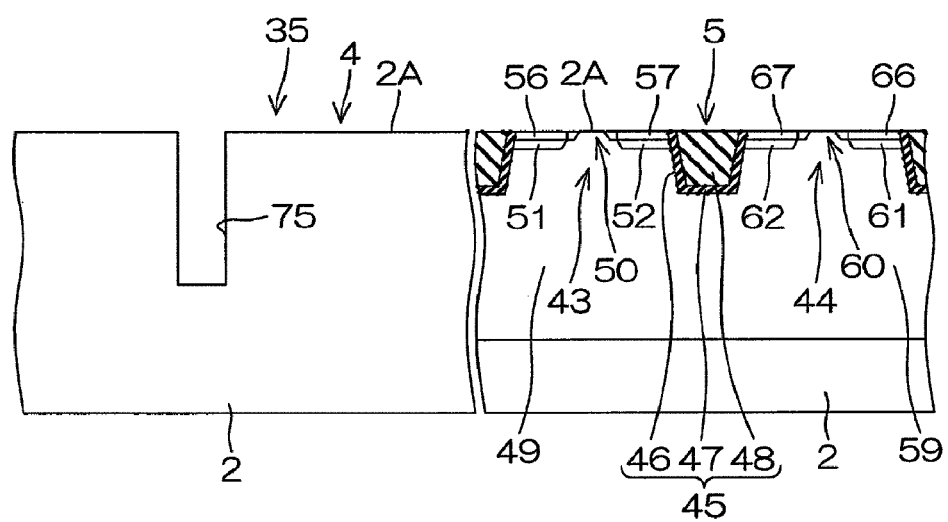
FIG. 5B is a schematic section view taken along section line B-B in FIG. 5A.

Next, as shown in FIGS. 5A and 5B, trenches 75 are formed by digging the semiconductor substrate 2 in the microphone region 4 from the front surface 2A to a thickness-wise intermediate position of the semiconductor substrate 2. The trenches 75 are formed through anisotropic deep reactive ion etching in which a resist pattern (not shown) is used as a mask. The trenches 75 are formed in two positions which will correspond to a pair of insulating films 21 (see FIGS. 1 and 2).

Figure 6A:
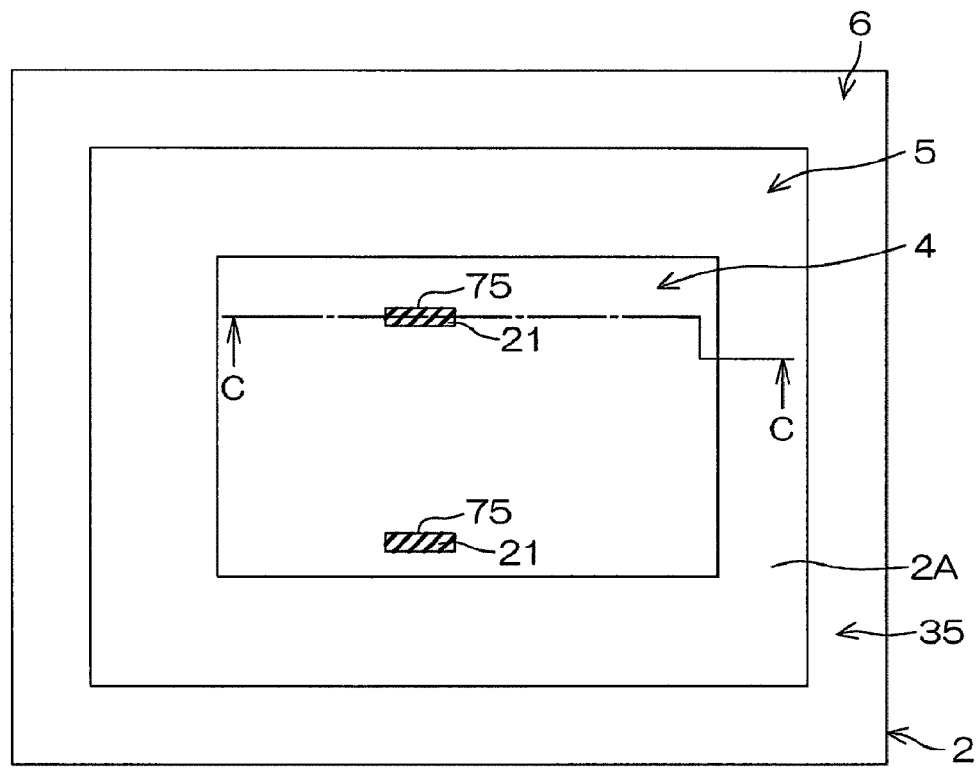
FIG. 6A is a schematic plan view illustrating the next step after the step illustrated in FIG. 5A.
Figure 6B:
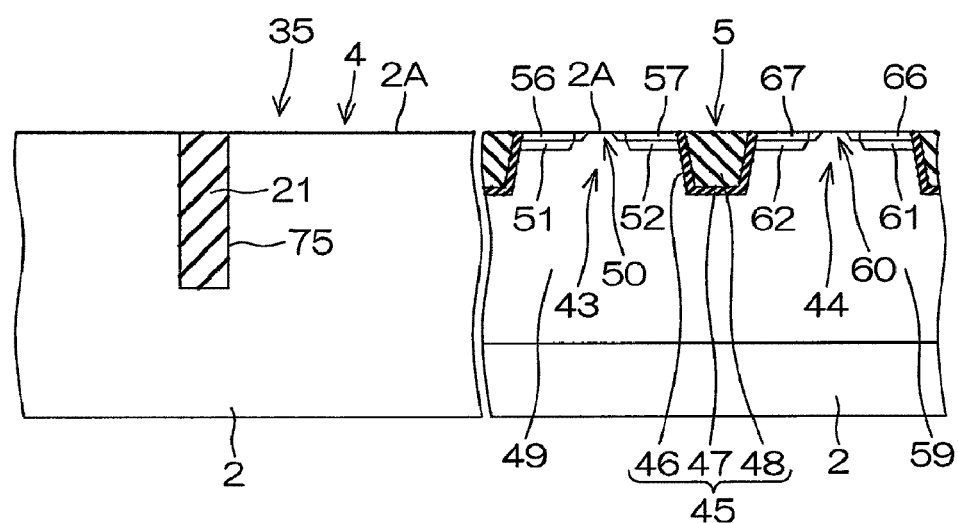
FIG. 6B is a schematic section view taken along section line C-C in FIG. 6A.
Figure 7A:
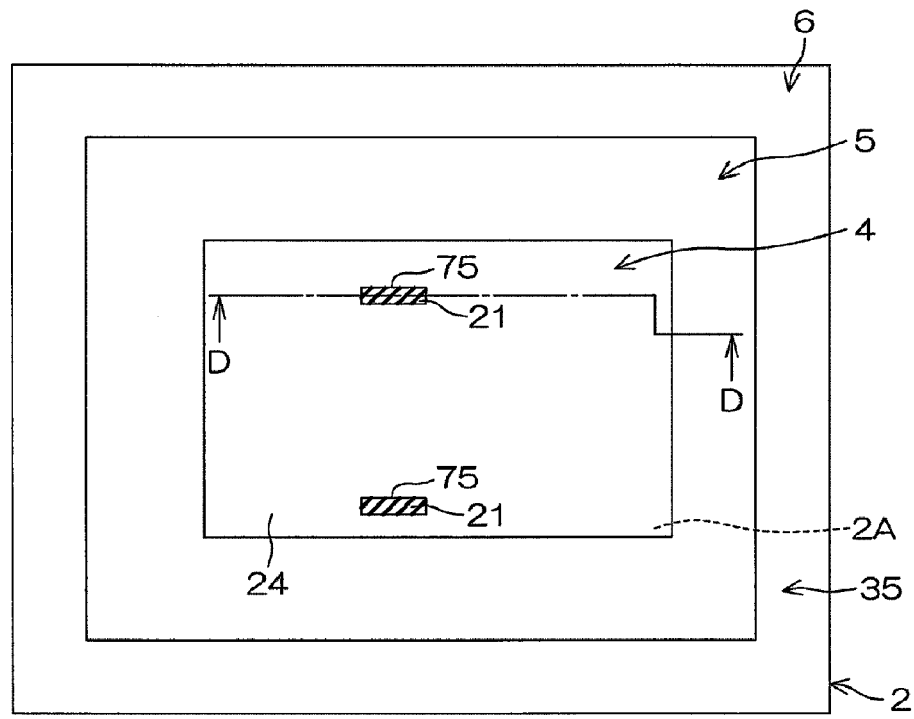
FIG. 7A is a schematic plan view illustrating the next step after the step illustrated in FIG. 6A.
Figure 7B:
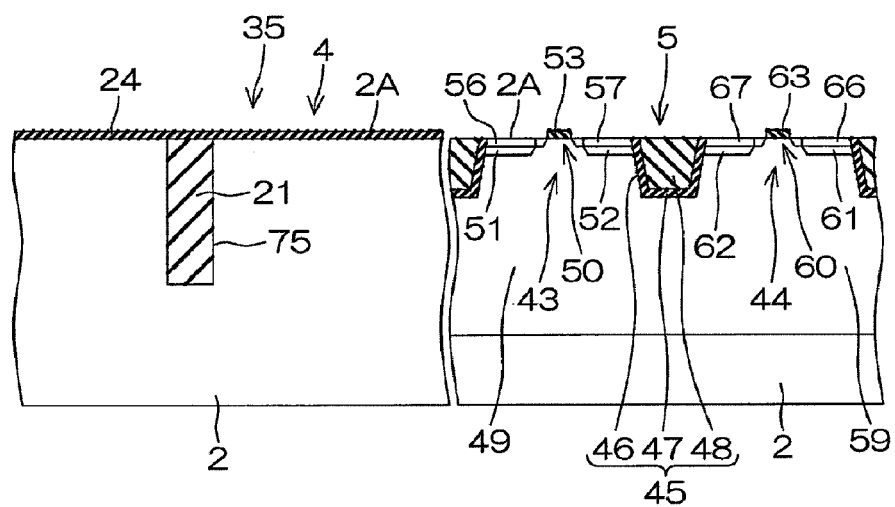
FIG. 7B is a schematic section view taken along section line D-D in FIG. 7A.

Next, as shown in FIGS. 6A and 6B, the inner surfaces of the respective trenches 75 are thermally oxidized by a thermal oxidation method and $SiO_2$ is filled into the trenches 75. Thus, insulating films 21 made of $SiO_2$ are formed within the trenches 75. Then, a film made of $SiO_2$ (a $SiO_2$ film) is formed on the front surface 2A of the semiconductor substrate 2 in the microphone region 4 and the integrated circuit region 5 by a CVD method. The $SiO_2$ film of the integrated circuit region 5 is selectively removed by etching in which a resist pattern (not shown) is used as a mask. As a result, as shown in FIG. 7B, the $SiO_2$ film formed on the entire front surface 2A of the semiconductor substrate 2 in the microphone region 4 becomes the insulating layer 24 set forth above. The $SiO_2$ film remaining on the integrated circuit region 5 become the gate insulating films 53 and 63 mentioned above.

Figure 8A:
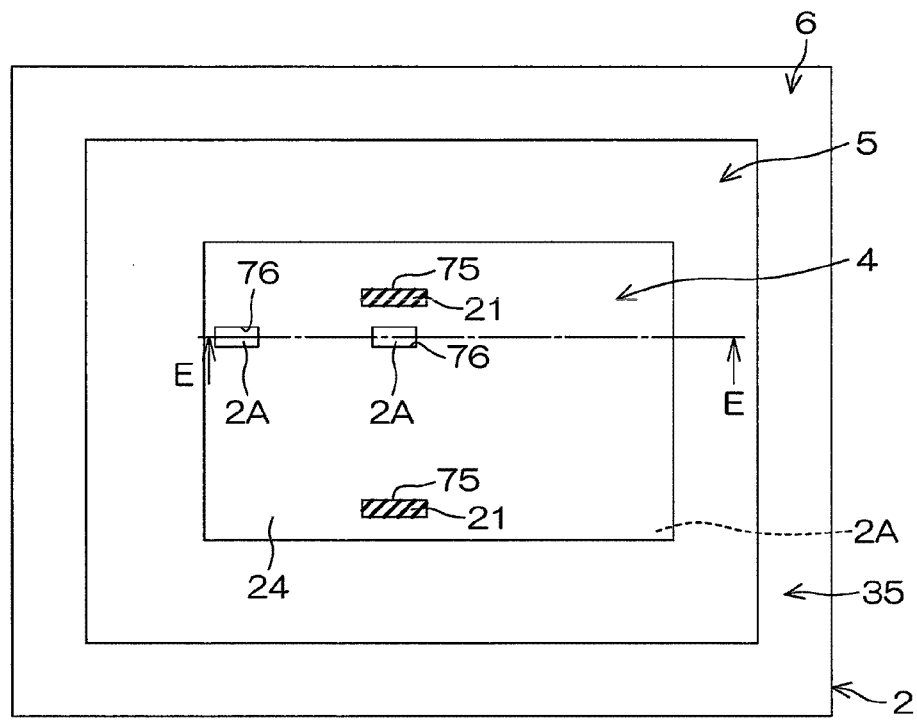
FIG. 8A is a schematic plan view illustrating the next step after the step illustrated in FIG. 7A.
Figure 8B:
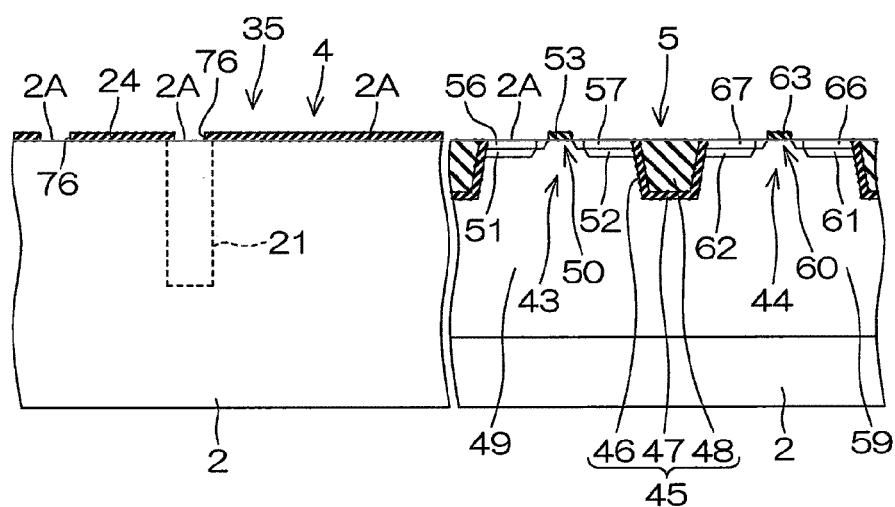
FIG. 8B is a schematic section view taken along section line E-E in FIG. 8A.

Next, as shown in FIG. 8B, the insulating layer 24 of the microphone region 4 is selectively removed by etching in which a resist pattern (not shown) is used as a mask, thereby forming openings 76 in the insulating layer 24. The openings 76 are formed in two positions corresponding to the first end portion 22A of the aforementioned first wiring layer 22 and the first end portion 23A of the aforementioned second wiring layer 23, respectively (see FIGS. 2 and 8A). One of the two openings 76 (the right opening in FIG. 8A) is formed between the pair of insulating films 21. The front surface 2A of the semiconductor substrate 2 is exposed from the respective openings 76. In FIG. 8B, the insulating films 21 are illustrated for reference.

Figure 9A:
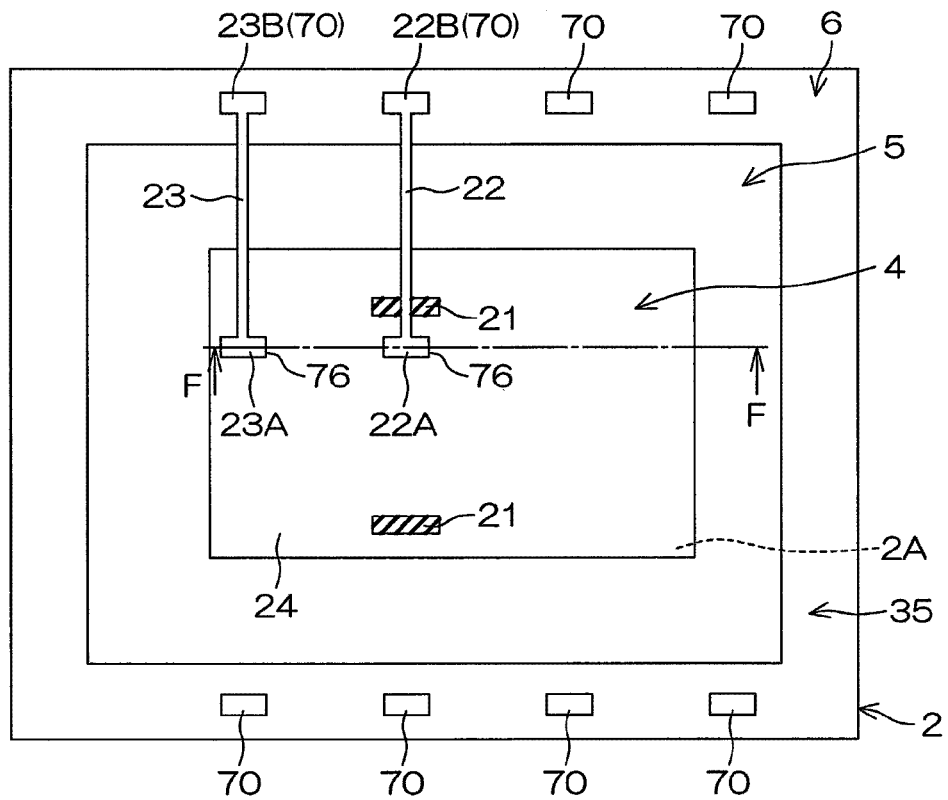
FIG. 9A is a schematic plan view illustrating the next step after the step illustrated in FIG. 8A.
Figure 9B:
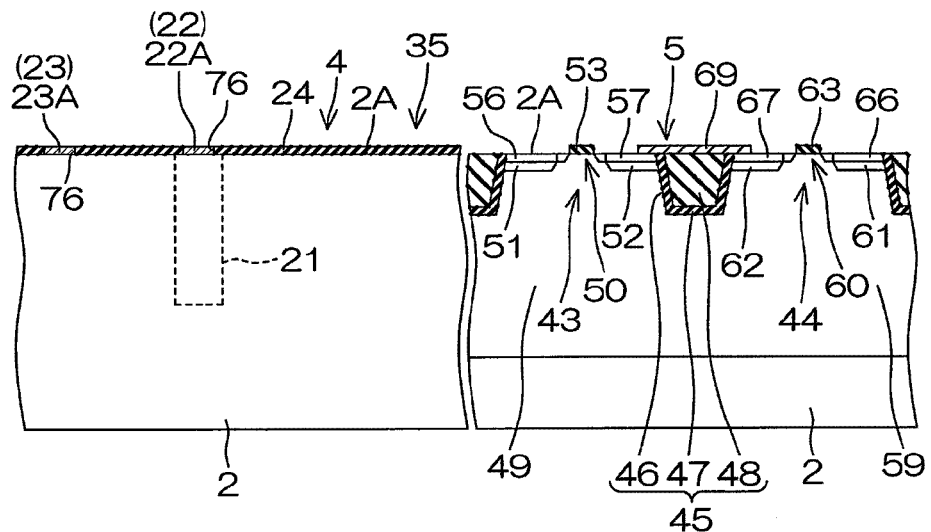
FIG. 9B is a schematic section view taken along section line F-F in FIG. 9A.

Next, Al is selectively deposited on the front surface 2A of the semiconductor substrate 2, the insulating layer 24 and the gate insulating films 53 and 63 by a sputtering method. The Al-deposited layer is patterned by a well-known patterning technology. Thus, as shown in FIGS. 9A and 9B, a first wiring layer 22 and a second wiring layer 23 are formed on the insulating layer 24 (see FIG. 9A). The third wiring layer 69 set forth above is formed on the front surface 2A of the semiconductor substrate 2 in the integrated circuit region 5 (see FIG. 9B). The first end portion 22A of the first wiring layer 22 enters the opening 76 positioned between the pair of insulating films 21 (the right opening 76 in FIG. 9A) and makes contact with the front surface 2A of the semiconductor substrate 2 exposed from the opening 76 (see FIG. 9B). The first end portion 23A of the second wiring layer 23 enters the other opening 76 different from the opening 76 positioned between the pair of insulating films 21 (the left opening 76 in FIG. 9A) and makes contact with the front surface 2A of the semiconductor substrate 2 exposed from the opening 76 (see FIG. 9B).

Figure 10A:
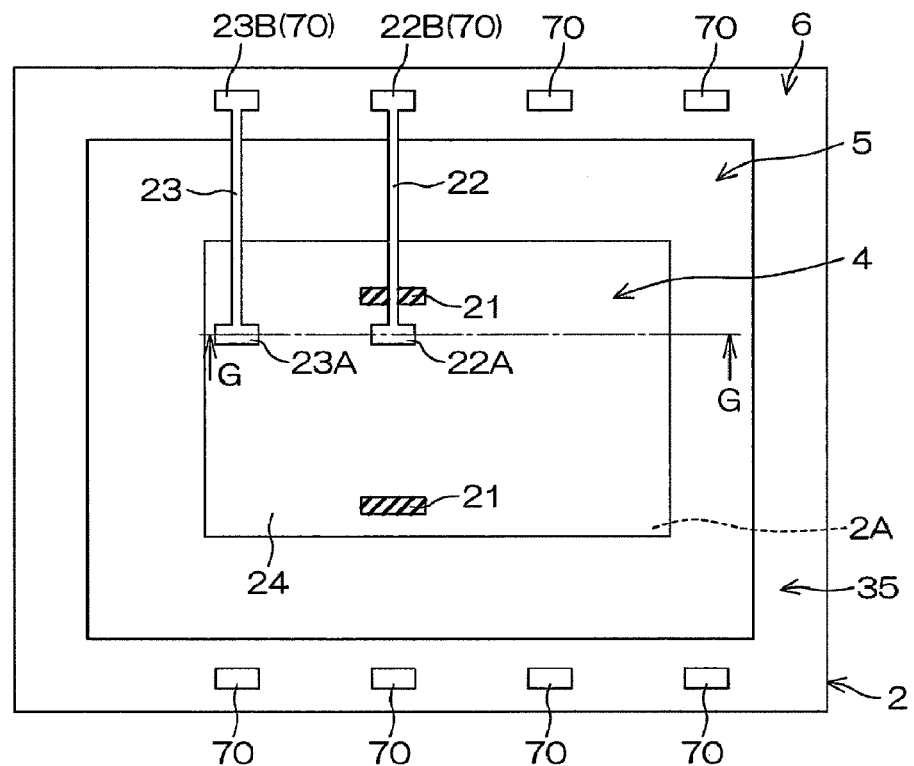
FIG. 10A is a schematic plan view illustrating the next step after the step illustrated in FIG. 9A.
Figure 10B:
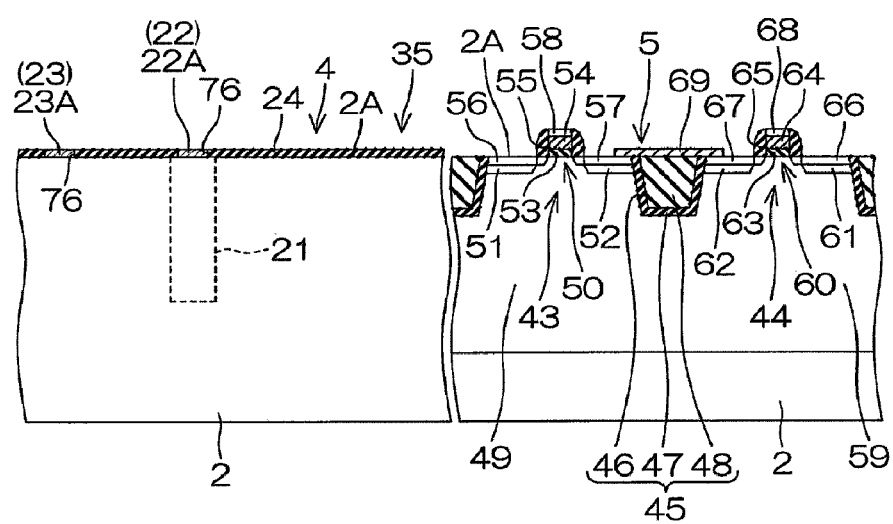
FIG. 10B is a schematic section view taken along section line G-G in FIG. 10A.
Figure 11A:
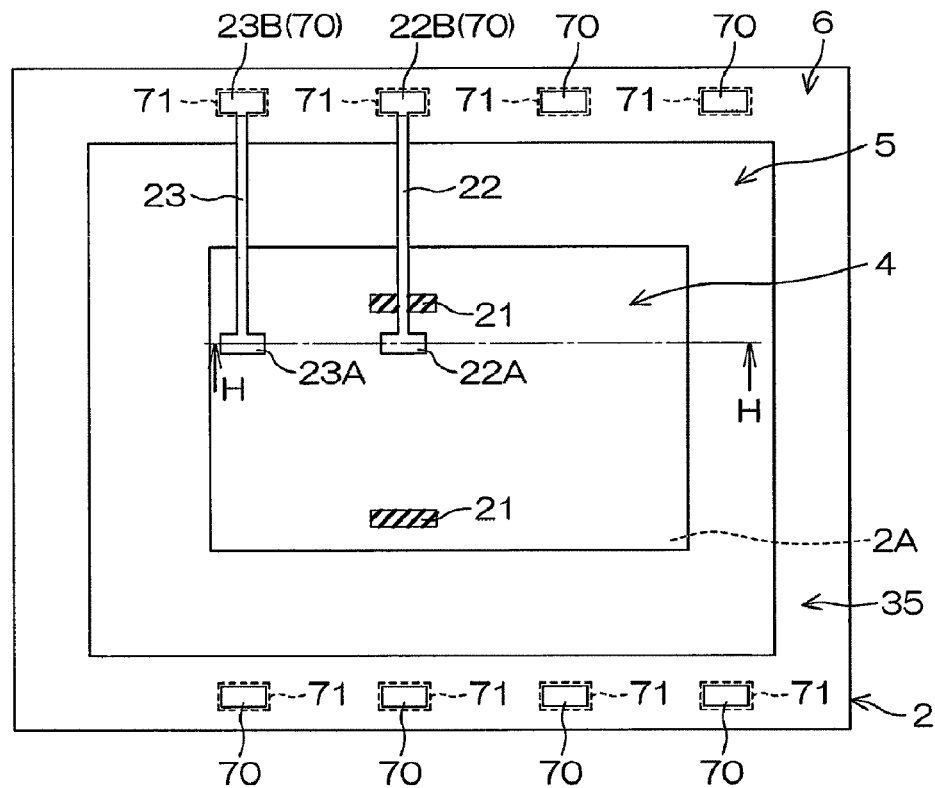
FIG. 11A is a schematic plan view illustrating the next step after the step illustrated in FIG. 10A.
Figure 11B:
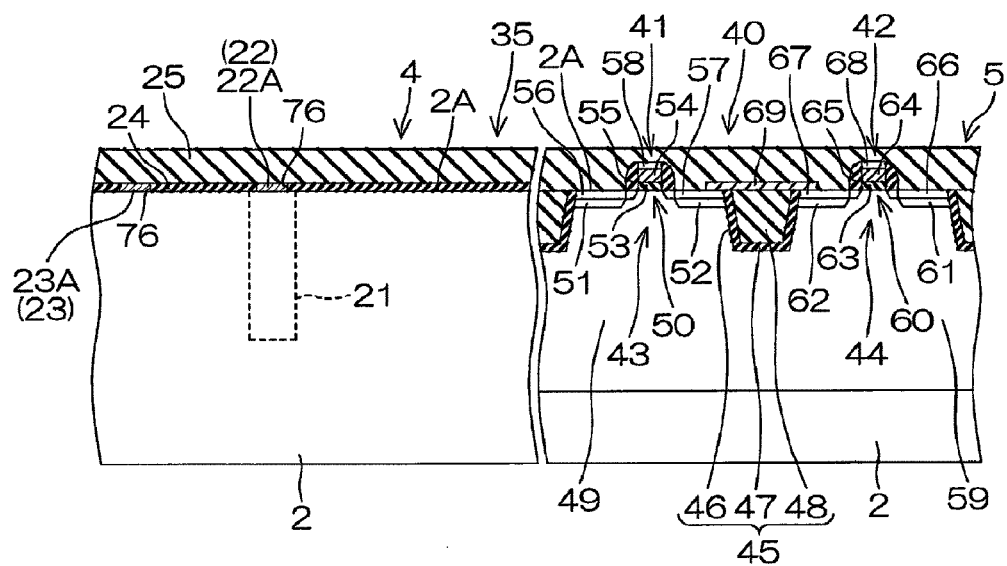
FIG. 11B is a schematic section view taken along section line H-H in FIG. 11A.

Next, as shown in FIG. 10B, a portion of the n-channel MOSFET 41 and a portion of the p-channel MOSFET 42 are formed in the semiconductor substrate 2 of the integrated circuit region 5 by a well-known CMOS technology. In FIG. 10B, gate electrodes 54 and 64, sidewalls 55 and 65, and silicide layers 58 and 68 are newly formed. Then, as shown in FIG. 11B, a passivation layer 25 is formed on the entire front surface 2A of the semiconductor substrate 2 by a CVD method. Openings 71 through which to expose the aforementioned connecting terminals 70 as pads are formed in the passivation layer 25 by etching in which a resist pattern (not shown) is used as a mask (see FIG. 11A). An integrated circuit element 40 is completely formed in the integrated circuit region 5 by forming the passivation layer 25.

Figure 12A:
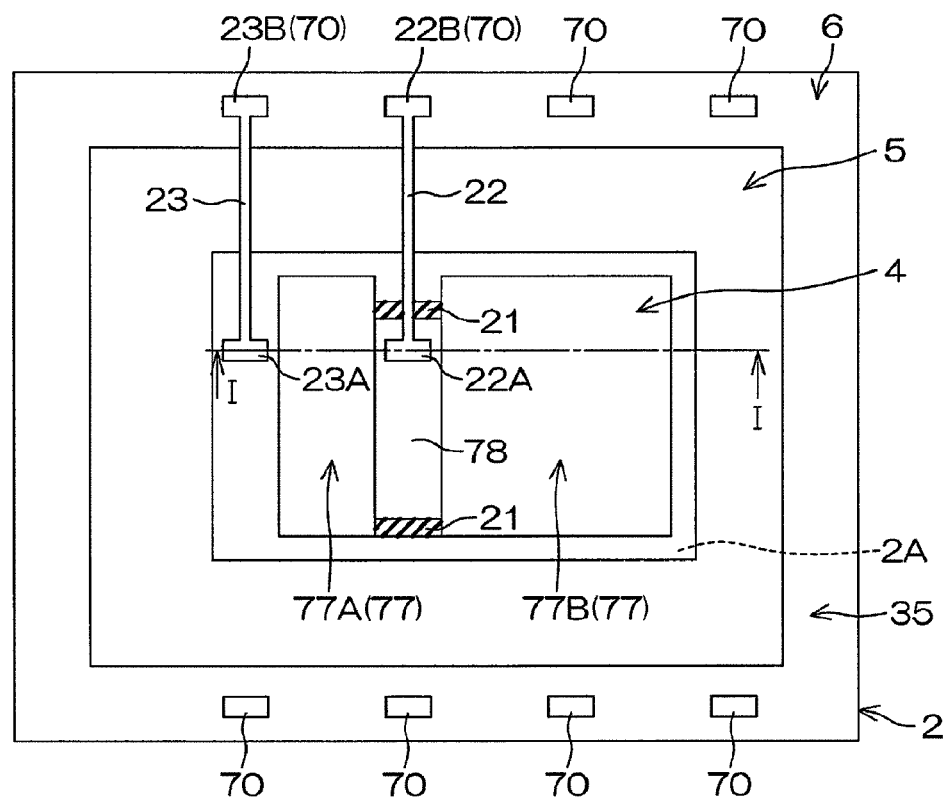
FIG. 12A is a schematic plan view illustrating the next step after the step illustrated in FIG. 11A.
Figure 12B:
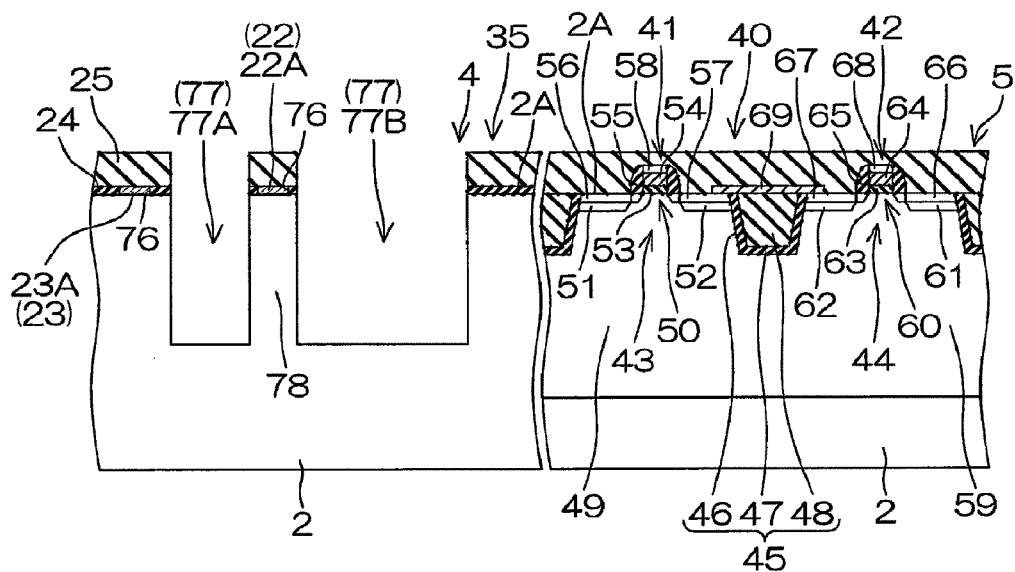
FIG. 12B is a schematic section view taken along section line I-I in FIG. 12A.

Next, as shown in FIGS. 12A and 12B, the passivation layer 25, the insulating layer 24 and the semiconductor substrate 2 in the microphone region 4 are dug down in that order by etching in which a resist pattern (not shown) is used as a mask, thereby forming trenches 77. The trenches 77 are formed in such positions as to interpose the pair of insulating films 21 therebetween. The number of the trenches 77 is two in total. A first trench 77A, one of the two trenches 77, is formed in the region between the first wiring layer 22 and the second wiring layer 23. A second trench 77B, the other of the two trenches 77, is formed in an opposite region of the first wiring layer 22 from the first trench 77A. More specifically, the first trench 77A is formed in the position corresponding to the first space 9A stated above and the second trench 77B is formed in the position corresponding to the second space 9B mentioned above (see FIGS. 1 and 2). When seen in a plan view, the first trench 77A has the same size as that of the first space 9A and the second trench 77B has the same size as that of the second space 9B.

The end surfaces of the pair of insulating films 21 near the first trench 77A are exposed in the first trench 77A. The end surfaces of the insulating films 21 near the second trench 77B are exposed in the second trench 77B. The portion of the semiconductor substrate 2 interposed between the first trench 77A and the second trench 77B becomes a diaphragm-shaped portion 78 having the same thickness as that of the aforementioned diaphragm 20 (see FIGS. 1 through 3). The diaphragm-shaped portion 78 is united with a portion of the semiconductor substrate 2 other than the diaphragm-shaped portion 78 while completely dividing the first trench 77A and the second trench 77B.

Figure 13A:
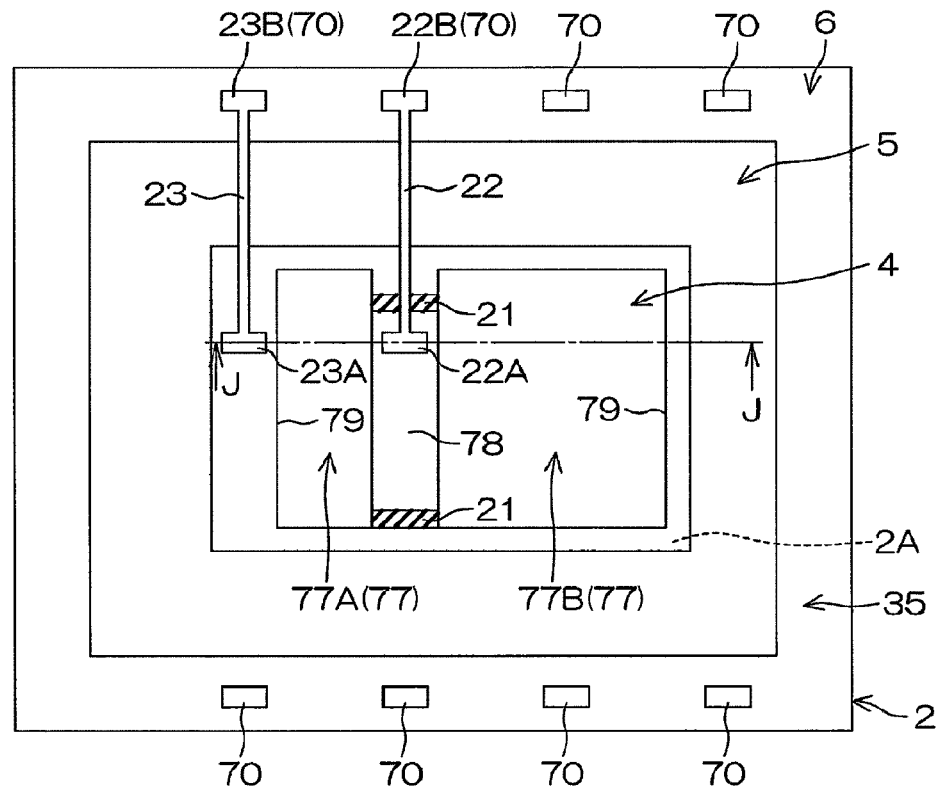
FIG. 13A is a schematic plan view illustrating the next step after the step illustrated in FIG. 12A.
Figure 13B:
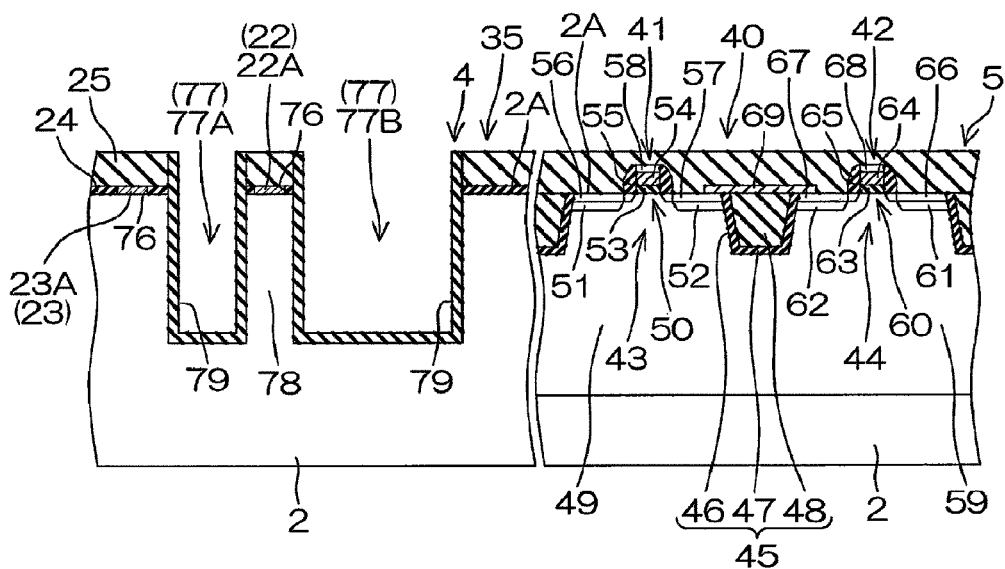
FIG. 13B is a schematic section view taken along section line J-J in FIG. 13A.
Figure 14A:
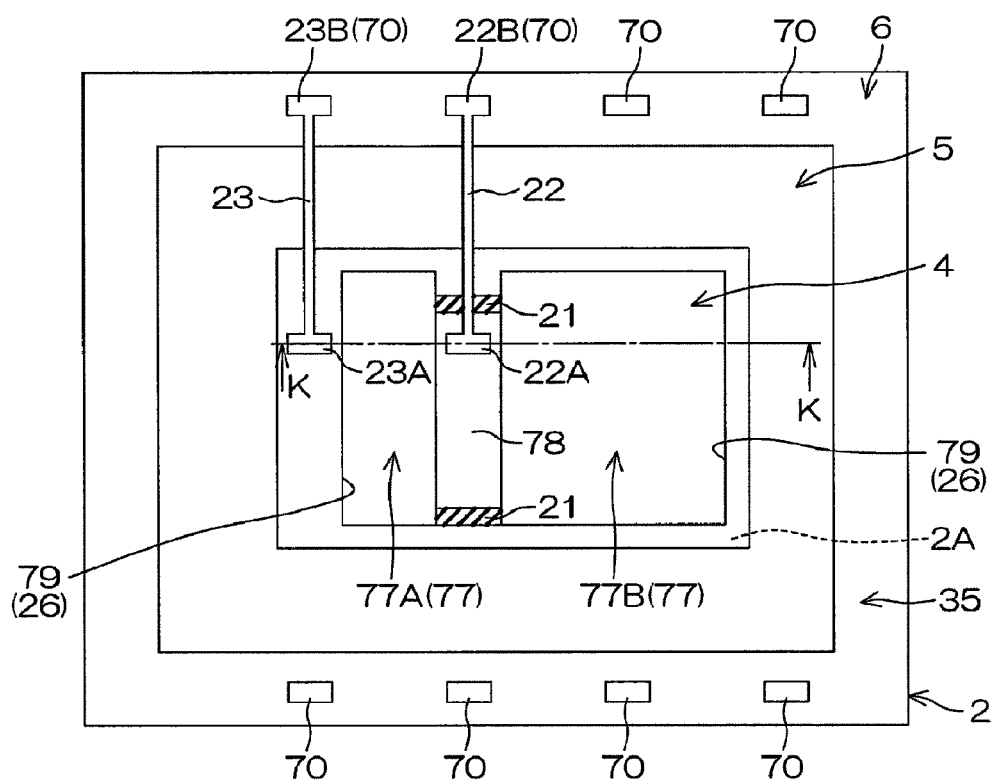
FIG. 14A is a schematic plan view illustrating the next step after the step illustrated in FIG. 13A.
Figure 14B:
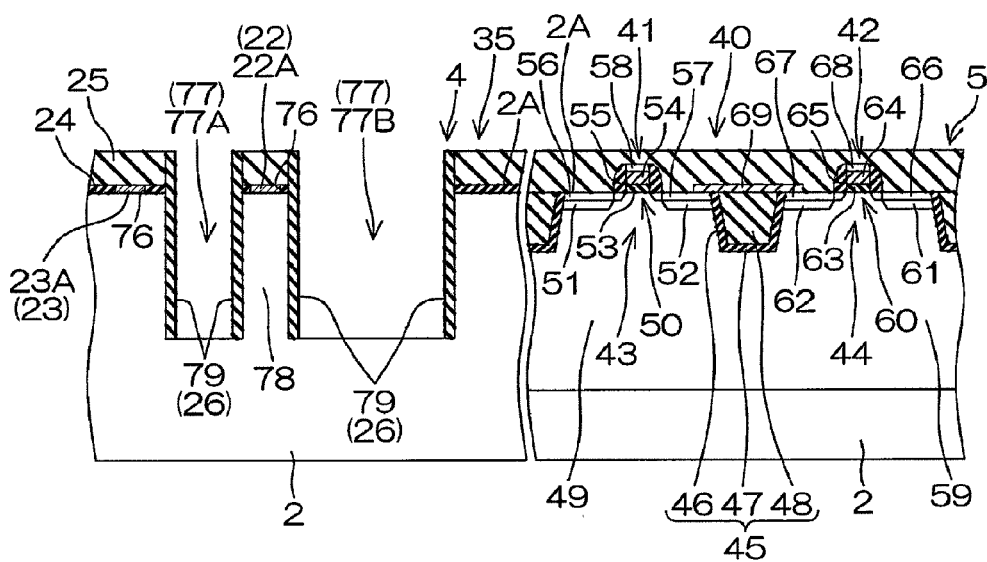
FIG. 14B is a schematic section view taken along section line K-K in FIG. 14A.

Next, as shown in FIG. 13B, films made of $SiO_2$ ($SiO_2$ films) 79 are formed on the entire inner surfaces of the first trench 77A and the second trench 77B by a CVD method. Then, as shown in FIG. 14B, the $SiO_2$ films 79 formed on the bottom surfaces of the first trench 77A and the second trench 77B are selectively removed by etching (reactive ion etching) in which a resist pattern (not shown) is used as a mask. The $SiO_2$ films 79 remaining on the inner surfaces (other than the bottom surfaces) of the first trench 77A and the second trench 77B become the insulating members 26 mentioned above (see FIG. 3). The semiconductor substrate 2 is exposed from the bottom surfaces of the first trench 77A and the second trench 77B.

Next, an etching agent is introduced into the first trench 77A and the second trench 77B from the front surface 2A of the semiconductor substrate 2 (isotropic etching). For example, in the case of using dry etching such as plasma etching, an etching gas is introduced into the first trench 77A and the second trench 77B. In the case of using wet etching, an etching liquid is introduced into the first trench 77A and the second trench 77B.

Thus, the substrate material of the semiconductor substrate 2 in the area of the bottom surfaces of the first trench 77A and the second trench 77B is isotropically etched using, as masks, the passivation layer 25 and the insulating members 26 formed on the inner surfaces of the first trench 77A and the second trench 77B. More specifically, starting from the bottom surfaces of the first trench 77A and the second trench 77B, the semiconductor substrate 2 is etched in the thickness direction thereof and in the direction orthogonal to the thickness direction.

Consequently, portions of the semiconductor substrate 2 located deeper than the insulating members 26 on the inner surfaces of the first trench 77A and the second trench 77B are etched. As a result, the bottom surfaces of the first trench 77A and the second trench 77B are broadened outward beyond the insulating members 26 on the inner surfaces of the respective trenches 77A and 77B. Further, portions of the semiconductor substrate 2 joined to the lower end of the diaphragm-shaped portion 78 (the end of the diaphragm-shaped portion 78 near the bottom surfaces of the first trench 77A and the second trench 77B) begin to be etched away at the sides of the first trench 77A and the second trench 77B closest to the diaphragm-shaped portion 78.

Figure 15A:
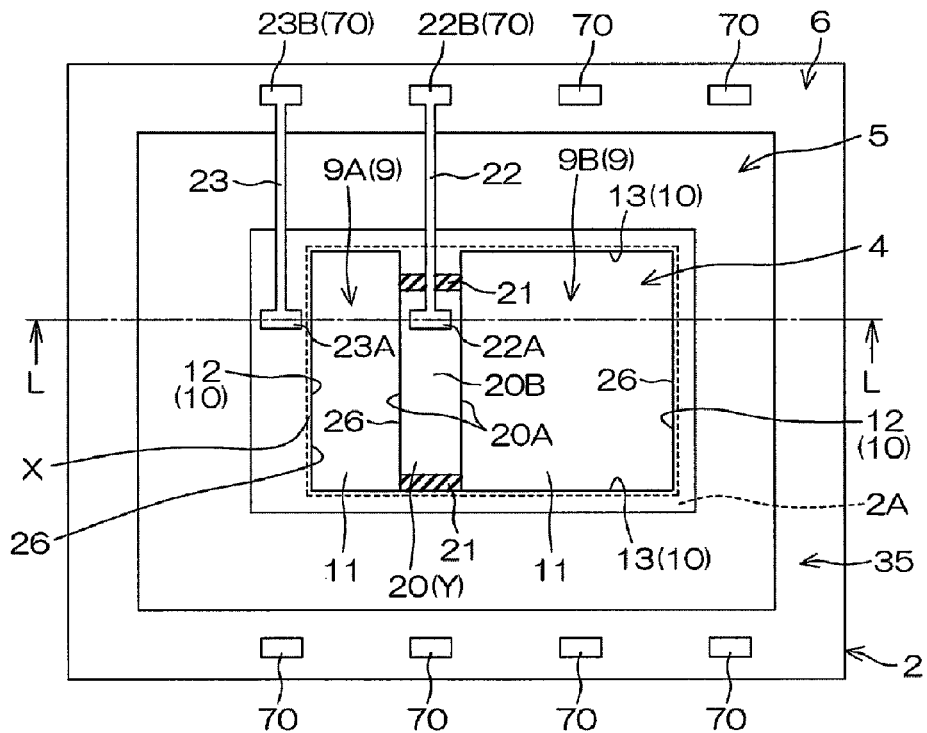
FIG. 15A is a schematic plan view illustrating the next step after the step illustrated in FIG. 14A.
Figure 15B:
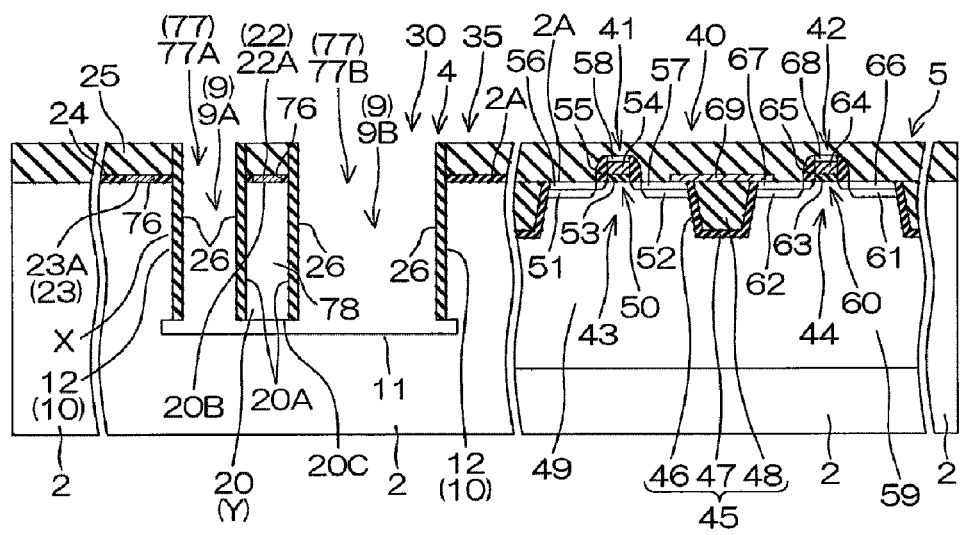
FIG. 15B is a schematic section view taken along section line L-L in FIG. 15A.
Figure 16:
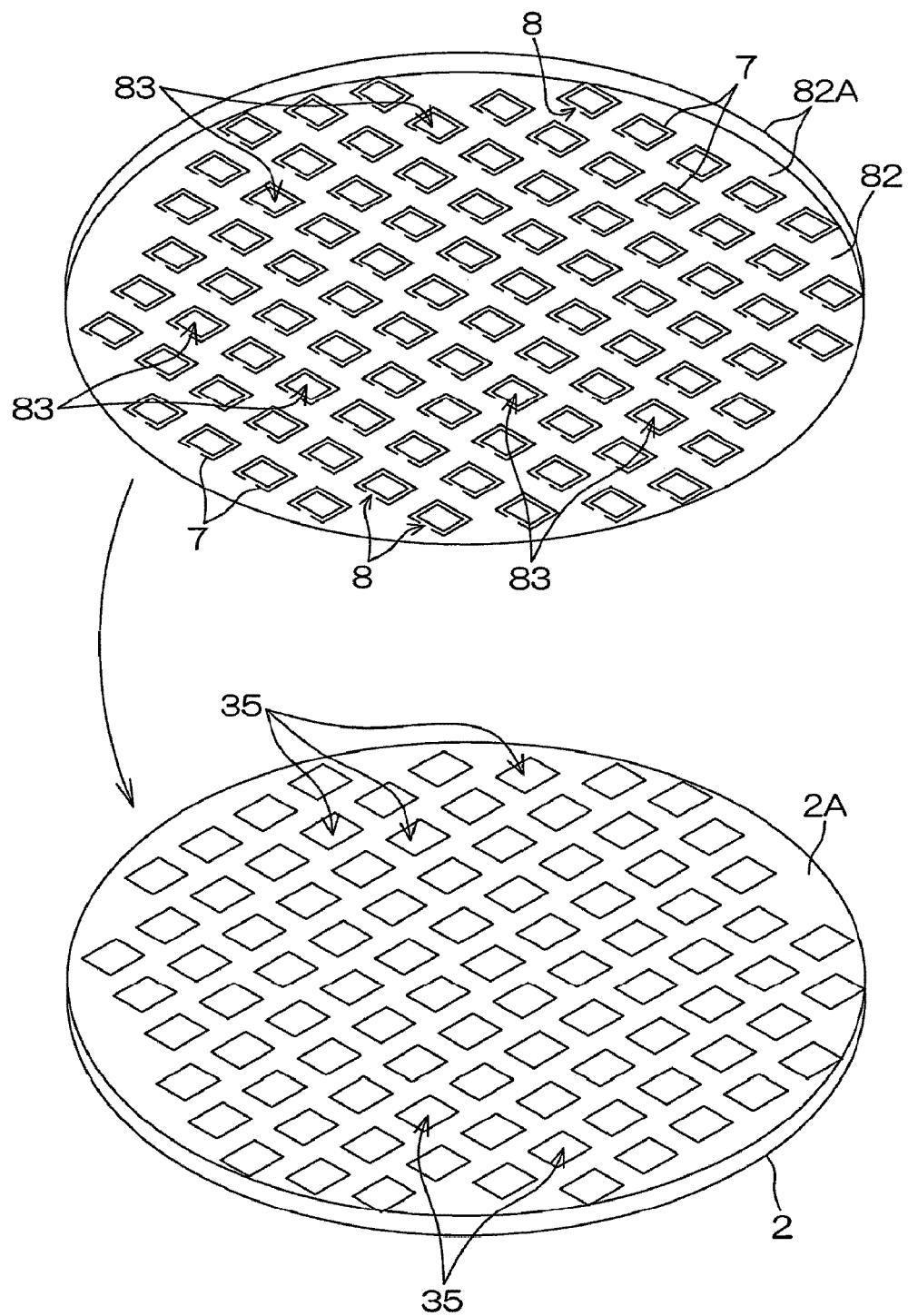
FIG. 16 is a schematic perspective view depicting a state in which a cover-side wafer is being bonded to a body-side wafer.

As a result of the isotropic etching, as shown in FIG. 15B, the first trench 77A and the second trench 77B grow deeper and are joined to each other under the diaphragm-shaped portion 78. Thus, the first trench 77A becomes the first space 9A of the recess 9 while the second trench 77B becomes the second space 9B of the recess 9. The recess 9 is completed by the first space 9A and the second space 9B. The diaphragm-shaped portion 78 becomes the diaphragm 20. In other words, the microphone element 30 is completely formed in the microphone region 4. In this state, the bottom surface 20C of the diaphragm 20 is spaced apart from the bottom surface of the recess 9. The portion of the diaphragm 20 interposed between the insulating films 21 is kept in a floating state in the recess 9 and is isolated and insulated from the portions of the semiconductor substrate 2 other than the diaphragm 20 (see FIGS. 1 and 2).

By virtue of the manufacturing steps described above, as shown in FIG. 15B, microphone elements 30 and integrated circuit elements 40 are collectively formed in a plurality of microphone forming regions 35 of the semiconductor substrate 2 (the semiconductor wafer). Next, steps for forming the cover 3 stated above are carried out. In these steps, a silicon substrate which will become the base of the cover 3 is prepared. The silicon substrate is called a cover-side wafer 82. In contrast, the semiconductor substrate 2 described above is sometimes called a body-side wafer.

The cover-side wafer 82 is a silicon disc having the same shape as that of the semiconductor substrate 2. A plurality of cover forming regions 83 is provided on one of circular surfaces 82A of the cover-side wafer 82. One cover 3 is formed in each of the cover forming regions 83. The cover forming regions 83 are formed in the same number as the number of the microphone forming regions 35 and are dispersedly arranged in the same arrangement pattern as the arrangement pattern of the microphone forming regions 35 of the body-side wafer 2.

The bonding agent 7 set forth above is applied, by screen printing, on the circular surface 82A having the cover forming regions 83. The bonding agent 7 is formed in a substantially C-like pattern to surround each of the cover forming regions 83. The cover-side wafer 82 is attached to the body-side wafer 2 so that the circular surface 82A having the cover forming regions 83 can face the front surface 2A of the body-side wafer 2. As a result, each of the cover forming regions 83 of the cover-side wafer 82 faces each of the microphone forming regions 35 of the body-side wafer 2. Thus, the bonding agent 7 existing around each of the cover forming regions 83 makes contact with front surface 2A of the body-side wafer 2 while surrounding the integrated circuit region 5 (see FIG. 1) of the corresponding microphone forming region 35. If heat treatment is performed in this state, the bonding agent 7 adheres to the front surface 2A of the body-side wafer 2 whereby the cover-side wafer 82 and the body-side wafer 2 are joined together.

Figure 17:
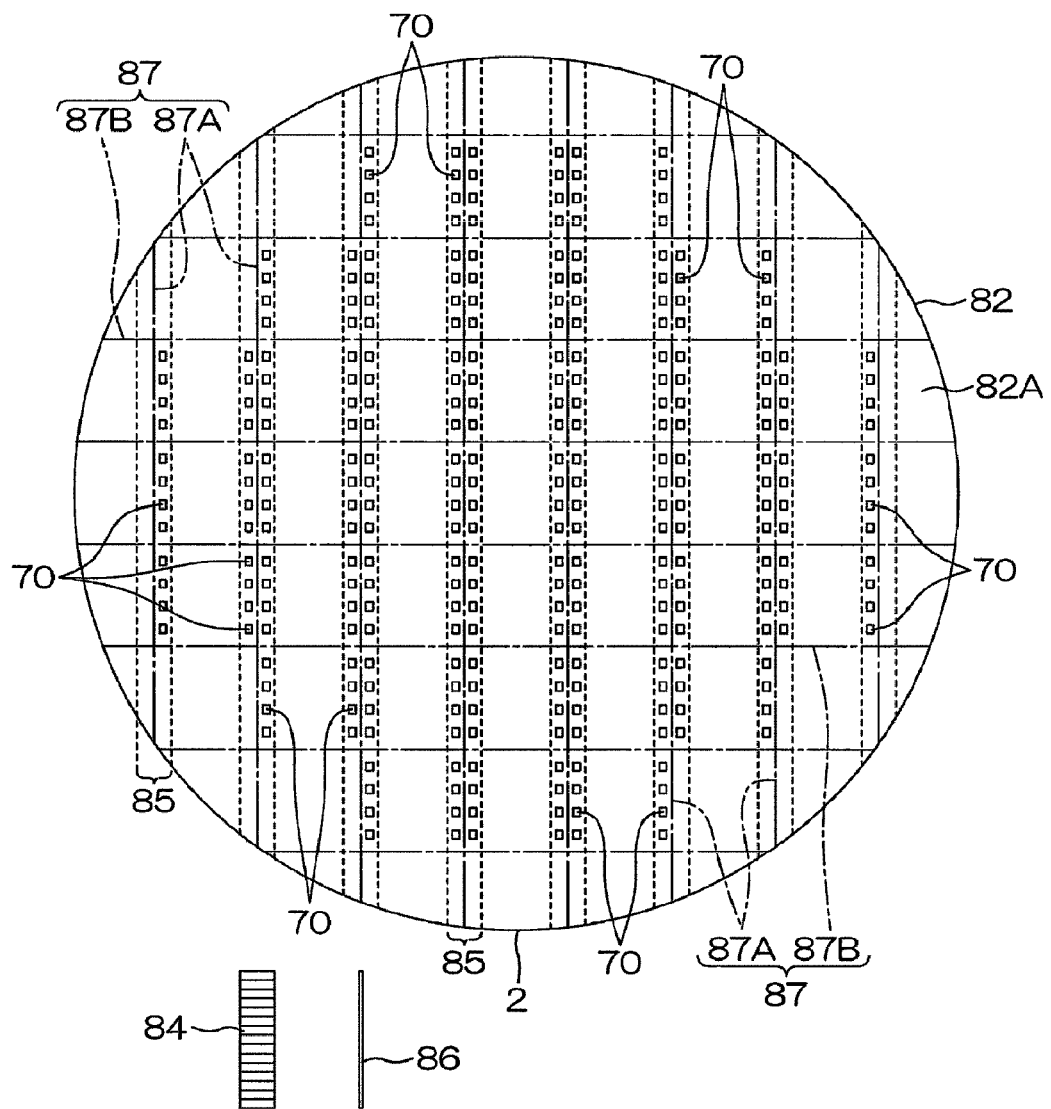
FIG. 17 is a plan view of the body-side wafer and the cover-side wafer bonded together.

As can be seen in FIG. 17, the cover-side wafer 82 and the body-side wafer 2 thus joined overlap with each other when seen in a plan view. In order to cut microphones 1 individually from the cover-side wafer 82 and the body-side wafer 2, there are formed first dicing lines 85 along which a first dicing blade 84 passes and second dicing lines 87 along which a second dicing blade 86 passes. The first dicing lines 85 and the second dicing lines 87 are imaginary lines rectilinearly extending along the borders between adjoining microphone forming regions 35 when seen in a plan view.

The first dicing lines 85 are relatively thick. Thus, the connecting terminals 70 of the adjoining microphone forming regions 35 arranged near the borders are positioned inside each of the first dicing lines 85. The second dicing lines 87 are thinner than the first dicing lines 85. The second dicing lines 87 extend along the border lines of the adjoining microphone forming regions 35. Each of the second dicing lines 87 includes a second dicing line 87A extending inside each of the first dicing lines 85 and a second dicing line 87B orthogonal to the second dicing line 87A.

The first dicing blade 84 and the second dicing blade 86 are disc-like grindstones and have cutting teeth formed on the circumferential surfaces thereof. The thickness of the first dicing blade 84 is substantially equal to the thickness (width) of each of the first dicing lines 85. The thickness of the second dicing blade 86 is substantially equal to the thickness (width) of each of the second dicing lines 87. The cover-side wafer 82 and the body-side wafer 2 joined together are fixed in place and the first dicing blade 84 is caused to move along each of the first dicing lines 85. The first dicing blade 84 moves along each of the first dicing lines 85 while rotating about the center axis thereof. At this time, the first dicing blade 84 begins to cut into the cover-side wafer 82. If the first dicing blade 84 passes through the cover-side wafer 82, the portion of the cover-side wafer 82 overlapping with each of the first dicing lines 85 is cut away. Thus, the connecting terminals 70 formed in each of the microphone forming regions 35 of the body-side wafer 2 are exposed from the side of the cover-side wafer 82.

Inspection of the microphone element 30 and the integrated circuit element 40 (see FIG. 3) formed in each of the microphone forming regions 35 is conducted by applying a bias voltage to each of the exposed connecting terminals 70. At the end of the inspection, the second dicing blade 86 is caused to move along each of the second dicing lines 87 (the second dicing lines 87A and 87B). The second dicing blade 86 moves along each of the second dicing lines 87 while rotating about the center axis thereof. At this time, the second dicing blade 86 begins to cut into the cover-side wafer 82 and penetrates the cover-side wafer 82 and the body-side wafer 2 in the thickness direction. If the second dicing blade 86 passes through the cover-side wafer 82 and the body-side wafer 2, the microphones 1 shown in FIGS. 1 through 3 are cut away individually from the cover-side wafer 82 and the body-side wafer 2.

In each of the microphones 1 described above, as shown in FIG. 1, the diaphragm 20 as the second electrode portion Y arranged within the recess 9 of the semiconductor substrate 2 is joined to the semiconductor substrate 2 by the insulating films 21 where the bottom surface 20C of diaphragm 20 is in a state of floating from the bottom surface of the recess 9. This enables the diaphragm 20 to vibrate freely. In each of the microphones 1, therefore, the diaphragm 20 becomes a movable electrode and the sidewall portion 12 as the first electrode portion X becomes a fixed electrode. In response to a vibration of the diaphragm 20, the capacitance between the diaphragm 20 and the sidewall portion 12 is changed. Accordingly, if the diaphragm 20 is vibrated by sound waves, it is possible to convert the sound waves to electric signals.

The second electrode portion Y is arranged within the recess 9 in such a posture as to extend in the depth direction of the recess 9. Therefore, if the semiconductor substrate 2 is kept horizontal, the second electrode portion Y extends substantially vertically. This eliminates the possibility that the second electrode portion Y is bent under the influence of gravity and adheres to the inner surface of the recess 9. Accordingly, the second electrode portion Y can be made thinner without considering the influence of gravity. This enables the second electrode portion Y to vibrate in response to a small change in sound wave. In other words, it is possible to enhance the sensitivity of the microphone 1. If the recess 9 is made deeper, the second electrode portion Y can be enlarged in the depth direction of the recess 9, thereby increasing the mutually-facing area of the first electrode portion X and the second electrode portion Y. This also makes it possible to enhance the sensitivity of the microphone 1.

Even if the second electrode portion Y is made larger in the depth direction of the recess 9, the plan-view size of the microphone 1 seen in the thickness direction of the semiconductor substrate 2 may remain unchanged. Therefore, despite an increase in the size of the second electrode portion Y, the microphone 1 can be formed to have a small size in the thickness direction of the semiconductor substrate 2. This makes it possible to increase the number of microphones 1 that can be manufactured from a single parent substrate (semiconductor wafer), eventually reducing the manufacturing cost of the microphone 1.

The first electrode portion X and the second electrode portion Y are both made of the same material as the semiconductor substrate 2. The microphone 1 can be manufactured by digging the recess 9 in the thickness direction of the semiconductor substrate 2 so that the second electrode portion Y can be arranged within the recess 9 and spacing the lower end (the bottom surface 20C) of the second electrode portion Y apart from the bottom surface of the recess 9. Therefore, when manufacturing the microphone 1, there is no need to perform a step of forming a sacrificing layer between the first electrode portion X and the second electrode portion Y and a step of removing the sacrificing layer to movably support the second electrode portion Y. This also makes it possible to reduce the manufacturing cost of the microphone 1.

As a result, it is possible to provide a microphone 1 which is highly sensitive, small in size and capable of reducing the manufacturing cost. Since at least one lateral edge of the diaphragm 20 is joined to the sidewall portion 13 of the recess 9 other than the first electrode portion X by the insulating films 21, the diaphragm 20 can readily vibrate about the base end portion thereof, namely one lateral edge thereof joined to the sidewall portion 13.

Since the first space 9A of the recess 9 is isolated from the outside of the recess 9 by the cover 3, it is possible to prevent external foreign materials from infiltrating into the first space 9A between the first electrode portion X and the second electrode portion Y (the diaphragm 20) and consequently reducing the sensitivity of the microphone 1. The cover 3 needs only to cover at least the first space 9A of the recess 9 to be able to prevent external foreign materials from infiltrating into the first space 9A between the first electrode portion X and the second electrode portion Y (the diaphragm 20).

The second space 9B of the recess 9 becomes an echo chamber that communicates with an external space of the recess 9 through the opening 8. Thus, sound waves enter the second space 9B through the opening 8 and echo within the second space 9B, in response to which the second electrode portion Y vibrates. This makes it possible to convert the sound waves to electric signals. Since the opening 8 is formed at the same time the cover 3 is bonded to the semiconductor substrate 2 by the bonding agent 7, it is possible to omit a step of separately forming the opening 8. This makes it possible to reduce the manufacturing cost.

<Modified Examples>

Description will now be made on certain modified examples of the foregoing embodiment.

Figure 18:
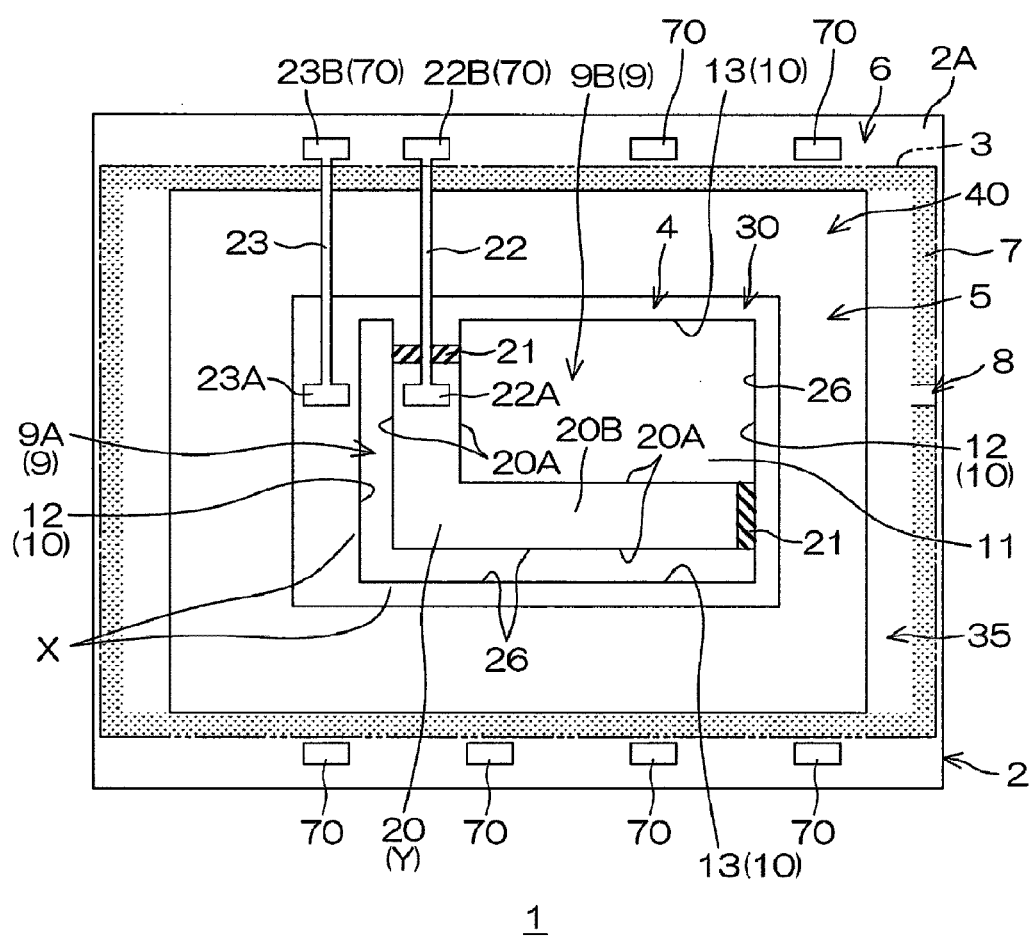
FIG. 18 is a schematic plan view showing a capacitance type microphone according to a first modified example.

FIG. 18 is a schematic plan view showing the microphone 1 according to a first modified example. As shown in FIG. 18, the diaphragm 20 may be bent into an L-like shape to extend along the sidewall portion 12 and the sidewall portion 13 orthogonal to the sidewall portion 12 so that the diaphragm 20 can face both the sidewall portion 12 and the sidewall portion 13 when seen in a plan view. In this case, the first electrode portion X made up of the sidewall portions 12 and 13 and the second electrode portion Y made up of the L-like diaphragm 20 help increase the mutually-facing area of the first electrode portion X and the second electrode portion Y. This makes it possible to increase the capacitance between the first electrode portion X and the second electrode portion Y and to enhance the sensitivity of the microphone 1.

Figure 19:
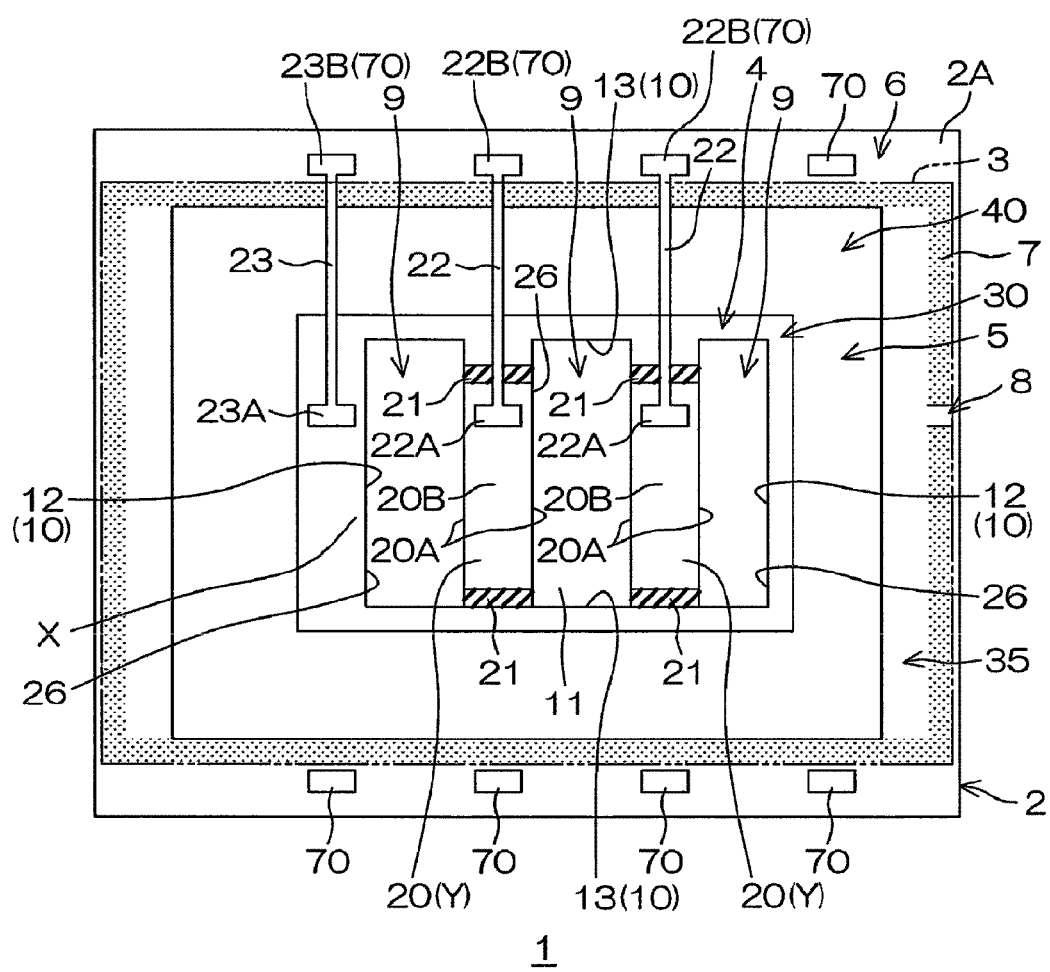
FIG. 19 is a schematic plan view showing a capacitance type microphone according to a second modified example.
Figure 20:
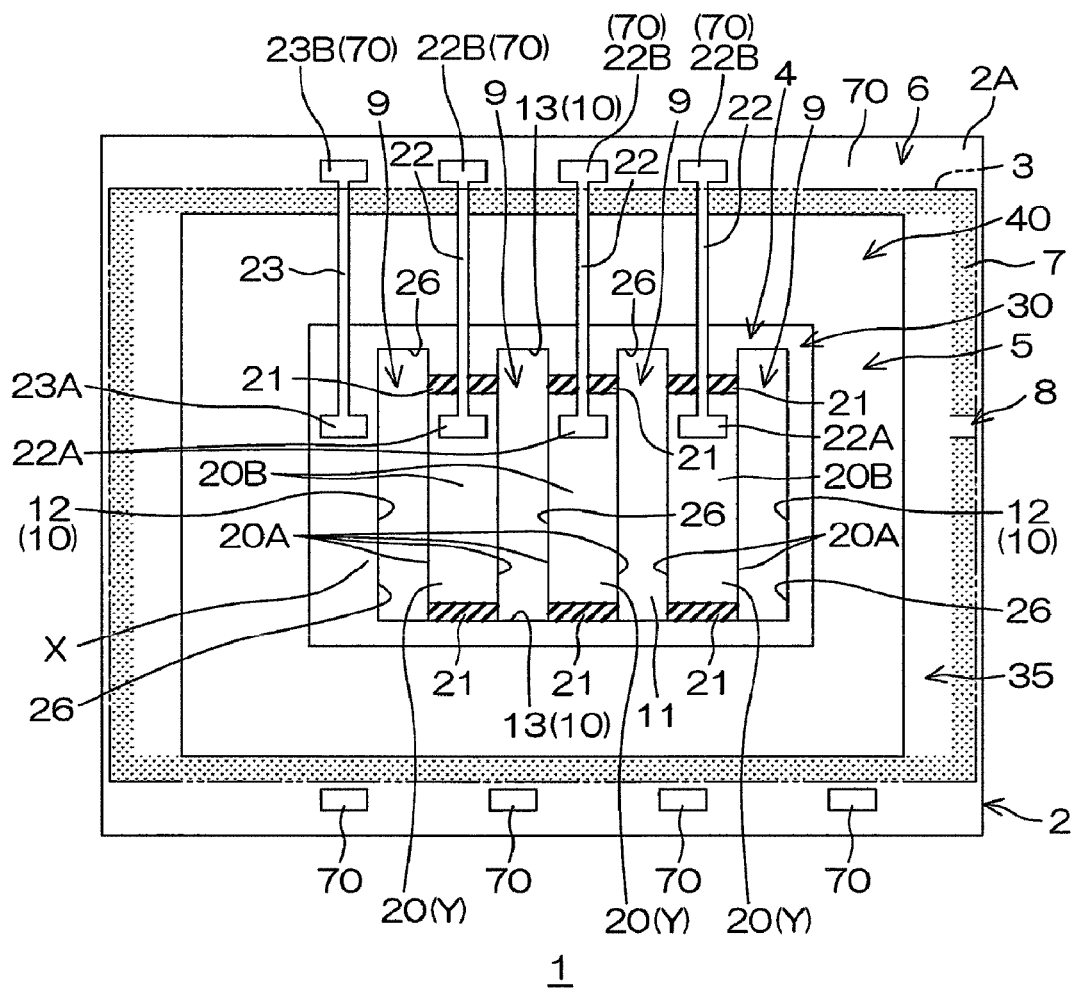
FIG. 20 is a schematic plan view showing a capacitance type microphone according to a third modified example.

FIG. 19 is a schematic plan view showing the microphone 1 according to a second modified example and FIG. 20 is a schematic plan view showing the microphone 1 according to a third modified example. While one diaphragm 20 is provided in the foregoing embodiment (see FIG. 2), it may be possible to provided a plurality of diaphragms 20. In FIG. 19, two diaphragms 20 are provided in a spaced-apart parallel relationship. In FIG. 20, three diaphragms 20 are provided in a spaced-apart parallel relationship. A first wiring layer 22 is provided in each of the diaphragms 20.

Figure 21:
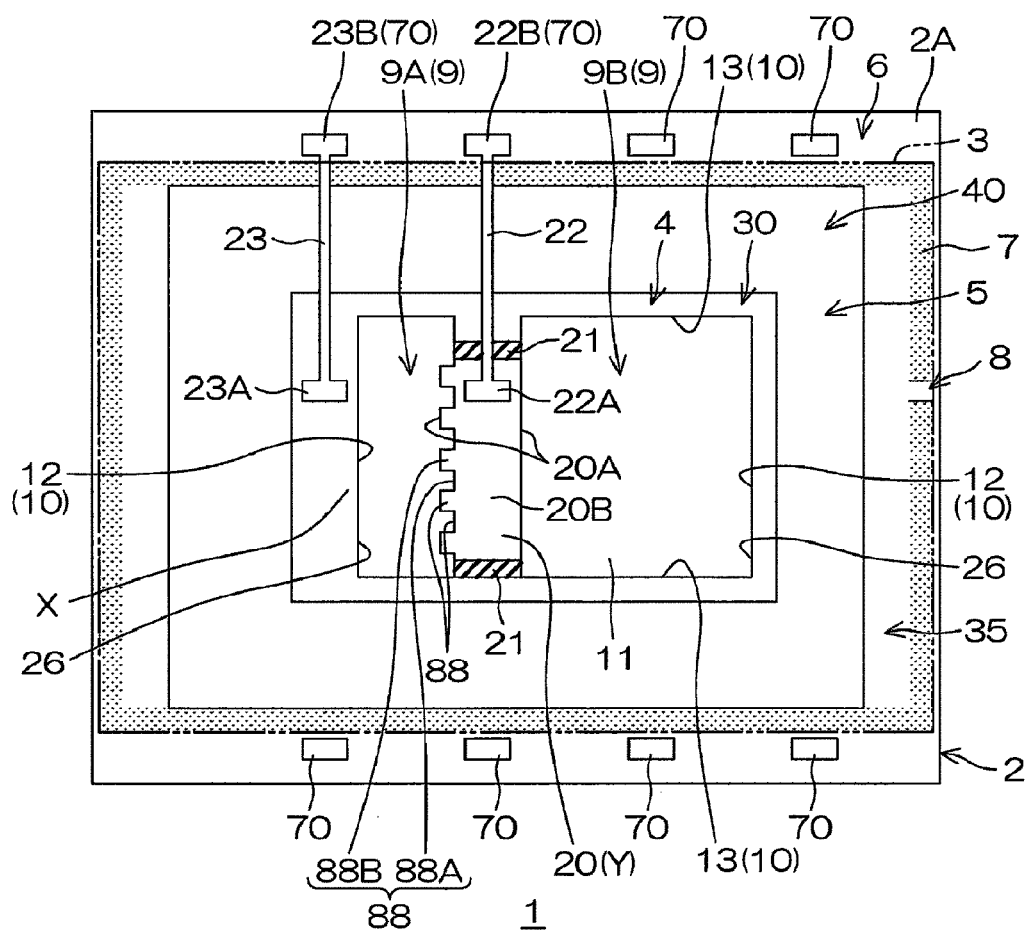
FIG. 21 is a schematic plan view showing a capacitance type microphone according to a fourth modified example.

FIG. 21 is a schematic plan view showing the microphone 1 according to a fourth modified example. As shown in FIG. 21, an irregularity 88 is formed on one of the major surfaces 20A of the diaphragm 20. The irregularity 88 shown in FIG. 21 is made up of depressed portions 88A and prominent portions 88B, both of which extend in the depth direction of the recess 9. In the etching step for forming the trenches 77 (see FIG. 12A), the irregularity 88 is formed by etching the semiconductor substrate 2 using a resist pattern (not shown) having an irregular shape corresponding to the irregularity 88 as a mask.

In this case, as the area of one of the major surfaces 20A of the diaphragm 20 is increased, the mutually-facing area of the diaphragm 20 (the second electrode portion Y) and the first electrode portion X grows larger while the spacing between the diaphragm 20 and the first electrode portion X becomes narrower due to the existence of the prominent portions 88B in the diaphragm 20. This makes it possible to increase the capacitance between the diaphragm 20 and the first electrode portion X. It is therefore possible to enhance the sensitivity of the microphone 1. In addition, the prominent portions 88B of the diaphragm 20 serve as a stabilizer for the diaphragm 20 and make contact with the first electrode portion X, thereby attenuating the vibration of the diaphragm 20.

Figure 22:
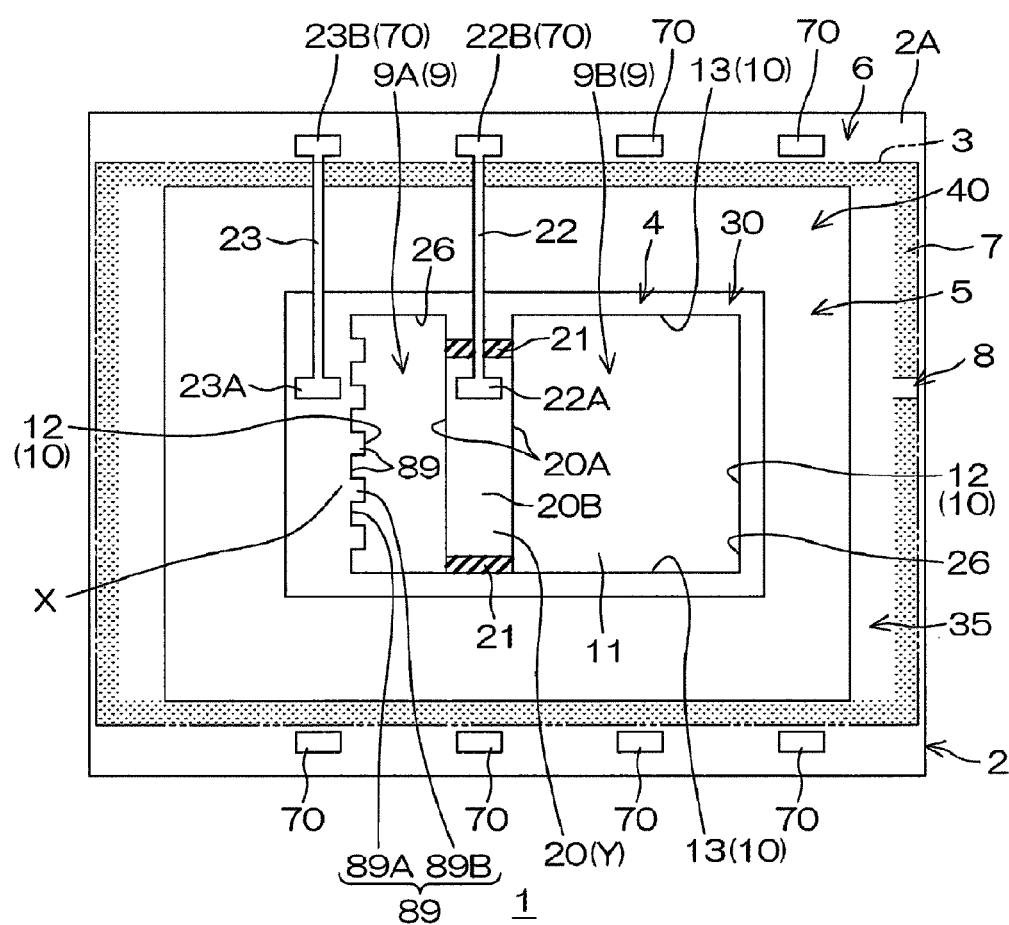
FIG. 22 is a schematic plan view showing a capacitance type microphone according to a fifth modified example.
Figure 23:
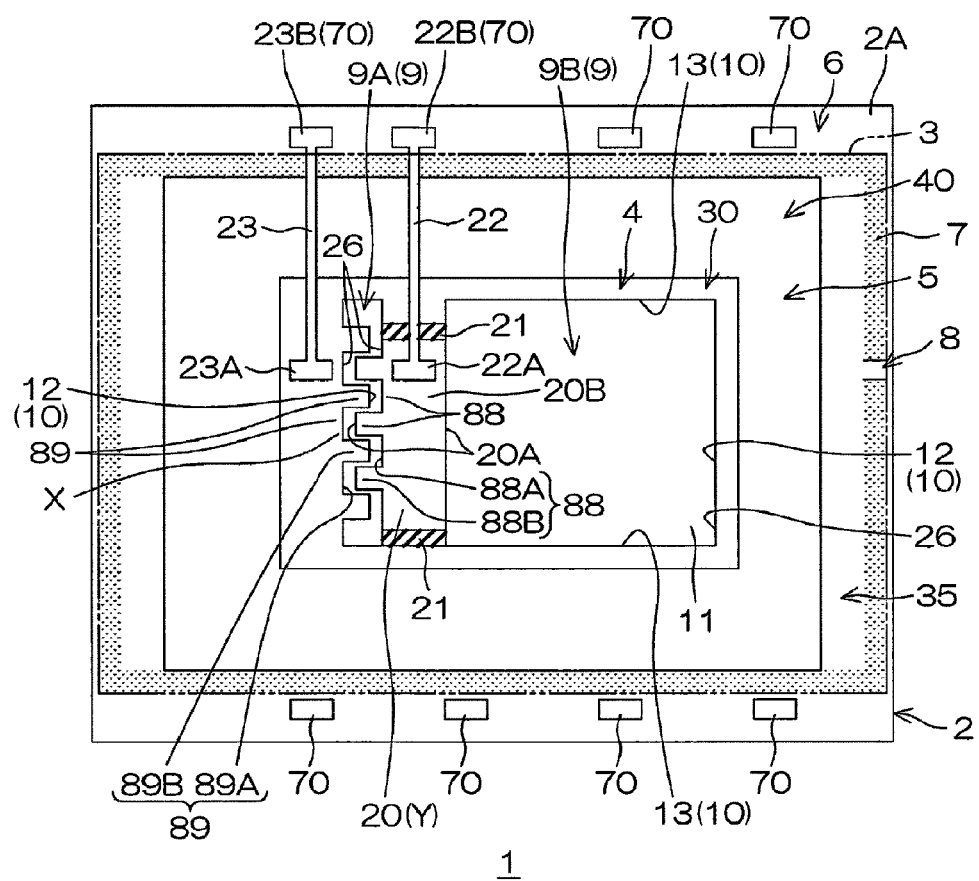
FIG. 23 is a schematic plan view showing a capacitance type microphone according to a sixth modified example.

FIG. 22 is a schematic plan view showing the microphone 1 according to a fifth modified example and FIG. 23 is a schematic plan view showing the microphone 1 according to a sixth modified example. As shown in FIG. 22, an irregularity 89 like the irregularity 88 may be formed on the surface of the first electrode portion X (the surface of the sidewall portion 12 facing the diaphragm 20). The irregularity 89 is made up of depressed portions 89A and prominent portions 89B. In the etching step for forming the trenches 77 (see FIG. 12A), the irregularity 89 is formed by etching the semiconductor substrate 2 using a resist pattern (not shown) having an irregular shape corresponding to the irregularity 89 as a mask.

In this case, as the area of the surface of the first electrode portion X is increased, the mutually-facing area of the diaphragm 20 (the second electrode portion Y) and the first electrode portion X grows larger. However, the spacing between the diaphragm 20 and the first electrode portion X becomes narrower due to the existence of the prominent portions 89B in the first electrode portion X. This makes it possible to increase the capacitance between the diaphragm 20 and the first electrode portion X. It is therefore possible to enhance the sensitivity of the microphone 1. In addition, the prominent portions 89B of the first electrode portion X serve as a stabilizer for the diaphragm 20 and make contact with the diaphragm 20, thereby attenuating the vibration of the diaphragm 20.

In FIG. 22, the irregularity 88 (see FIG. 21) is not formed on one of the major surfaces 20A of the second electrode portion Y. However, as shown in FIG. 23, an irregularity 88 may be formed on one of the major surfaces 20A of the diaphragm 20 (the second electrode portion Y) while forming an irregularity 89 on the surface of the first electrode portion X. By doing so, it is possible to further improve the effect of enhancing the sensitivity of the microphone 1 and the effect of attenuating the vibration of the diaphragm 20.

In FIG. 23, the prominent portions 88B on the major surface 20A of the diaphragm 20 are inserted into the depressed portions 89A on the surface of the first electrode portion X. The prominent portions 89B on the surface of the first electrode portion X are inserted into the depressed portions 88A on the major surface 20A of the diaphragm 20. In this case, the mutually-facing area of the diaphragm 20 (the second electrode portion Y) and the first electrode portion X grows larger, which makes it possible to increase the capacitance between the diaphragm 20 and the first electrode portion X. It is therefore possible to enhance the sensitivity of the microphone 1.

Figure 24:
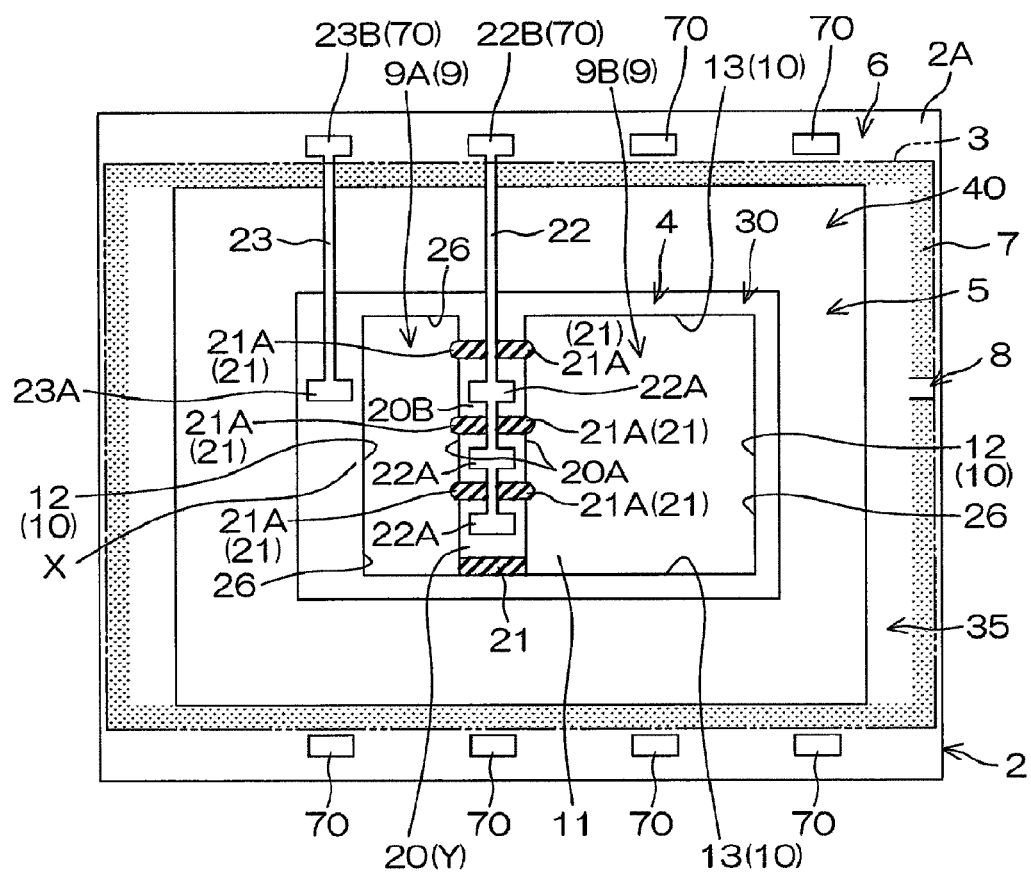
FIG. 24 is a schematic plan view showing a capacitance type microphone according to a seventh modified example.

FIG. 24 is a schematic plan view showing the microphone 1 according to a seventh modified example. In the foregoing embodiment, the insulating films 21 are formed on the diaphragm 20, one at each longitudinal end side of the diaphragm 20 (see FIG. 2). However, as shown in FIG. 24, additional insulating films 21 may be further provided between the insulating films 21 existing at the opposite sides of the diaphragm 20. It may be possible to provide a single additional insulating film 21 or a plurality of additional insulating films 21. A first wiring layer 22 is provided in the region of the top surface 20B of the diaphragm 20 between the adjoining insulating films 21.

The respective insulating films 21 are formed to protrude outward from the major surfaces 20A of the diaphragm 20. In the etching step for forming the trenches 77 (see FIG. 12A), the semiconductor substrate 2 is etched under such an etching condition that the respective insulating films 21 protrude outward from the major surfaces 20A of the diaphragm 20. The portions of the respective insulating films 21 protruding from the major surface 20A facing the first electrode portion X are projections 21A. The projections 21A serve as a stabilizer for the diaphragm 20 and make contact with the first electrode portion X, thereby attenuating the vibration of the diaphragm 20. The diaphragm 20 and the first electrode portion X are made of the same material (Si). In contrast, the projections 21A, which make contact with the first electrode portion X, are made of $SiO_2$. It is therefore possible to prevent the diaphragm 20 from adhering to the first electrode portion X.

Figure 25:
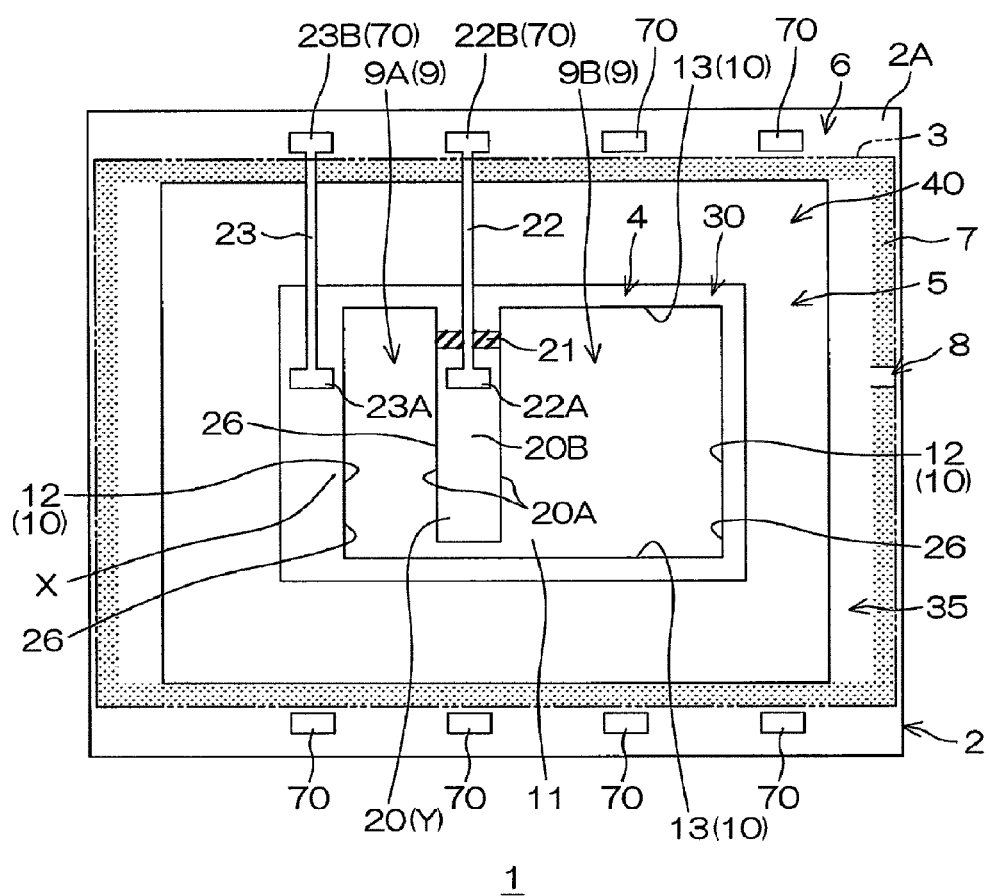
FIG. 25 is a schematic plan view showing a capacitance type microphone according to an eighth modified example.

FIG. 25 is a schematic plan view showing the microphone 1 according to an eighth modified example. In the foregoing embodiment, the diaphragm 20 is installed between the pair of sidewalls 13 facing each other in the transverse direction of the recess 9 when seen in a plan view. Thus, the diaphragm 20 is supported at the opposite sides thereof by the sidewalls 13 (the semiconductor substrate 2) (see FIGS. 1 and 2). In contrast, the diaphragm 20 shown in FIG. 5 is joined to only one of the sidewalls 13 through an insulating film 21. The diaphragm 20 is not installed to fully extend between the pair of sidewalls 13 but is supported at one side thereof by one of the sidewalls 13 (the semiconductor substrate 2). In the etching step for forming the trenches 77 (see FIG. 12A), the semiconductor substrate 2 is etched so that the first trench 77A and the second trench 77B can be joined to each other at the side of one of the sidewalls 13. Thus, the diaphragm 20 can be formed into a one-side supported (cantilevered) configuration.

Figure 26:
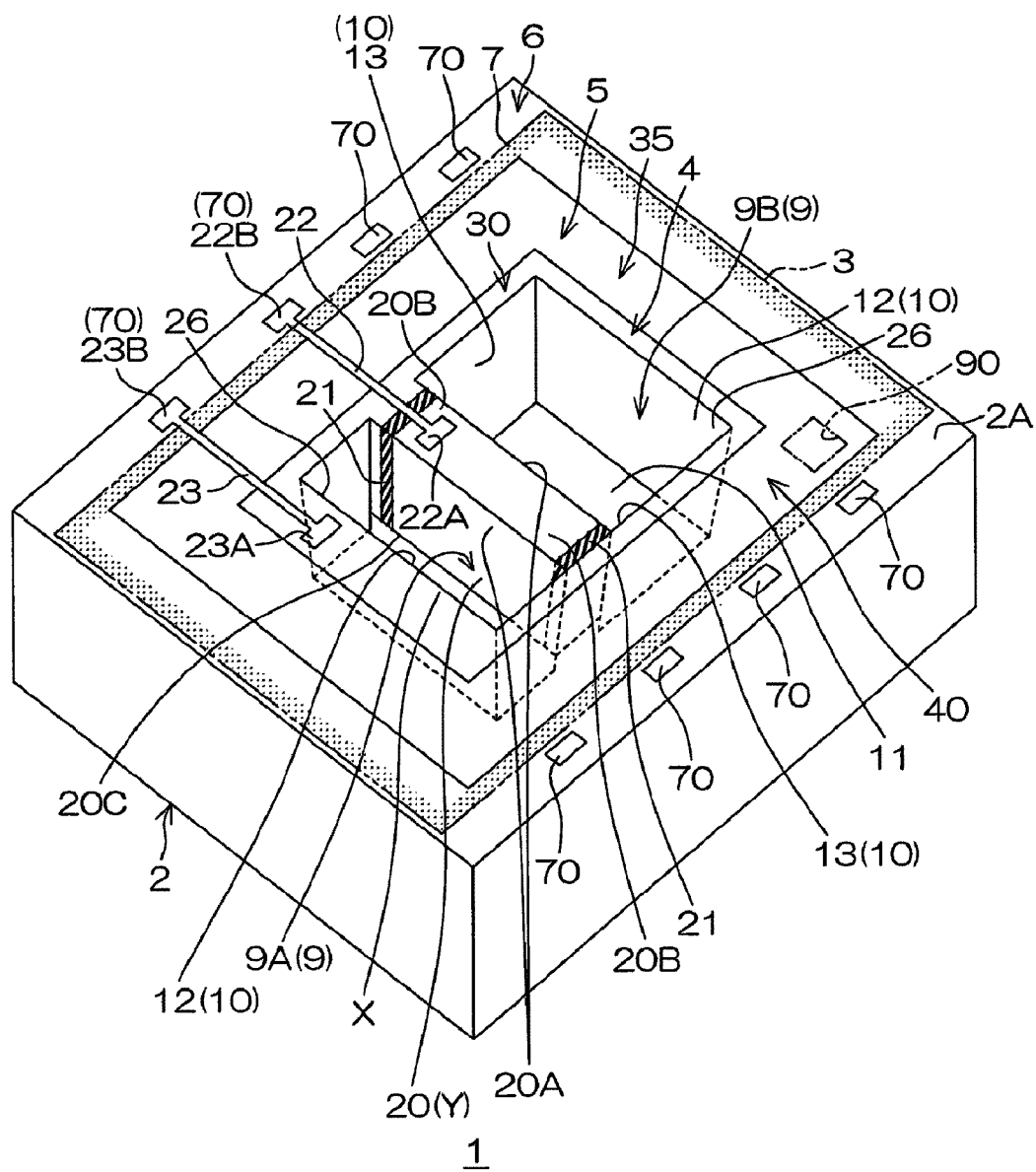
FIG. 26 is a schematic perspective view showing a capacitance type microphone according to a ninth modified example.

The diaphragm 20 is more easily bent when supported at one side than when supported at both sides. This makes it possible to further enhance the sensitivity of the microphone 1. FIG. 26 is a schematic perspective view showing the microphone 1 according to a ninth modified example. In the foregoing embodiment, the bonding agent 7 is formed into a generally C-like shape so that a spacing (an opening 8) can be defined between the outer peripheral edge portion of the cover 3 and the front surface 2A of the semiconductor substrate 2 in the location where the bonding agent 7 does not exist. An external sound wave is introduced into the recess 9 through the opening 8 (see FIG. 1).

Alternatively, as shown in FIG. 26, an opening 90 may be formed in the cover 3 so that external sound waves can be introduced into the recess 9 through the opening 90. The opening 90 is formed in the portion of the cover 3 that does not face the recess 9. The opening 90 penetrates through the cover 3 in the thickness direction. In this case, the bonding agent 7 is not formed into a substantially C-like shape but into an annular shape, thereby completely (exhaustively) surrounding the space between the cover 3 and the front surface 2A of the semiconductor substrate 2. The opening 90 brings the second space 9B of the recess 9 into communication with the external space of the recess 9 across the space between the cover 3 and the front surface 2A of the semiconductor substrate 2.

In this case, the second space 9B becomes an echo chamber that communicates with the external space of the recess 9 through the opening 90 formed in the cover 3. Thus, sound waves enter the second space 9B through the opening 90 and echo within the second space 9B, in response to which the second electrode portion Y vibrates. This enables the microphone 1 to convert the sound waves to electric signals. Since the opening 90 is formed in the portion of the cover 3 that does not face the recess 9, it is possible to prevent external foreign materials from infiltrating into the recess 9 with ease.

The present invention can be embodied in other forms than described above. Many different changes in design may be made without departing from the scope of the subject matters defined in the claims. While a capacitance type microphone is taken as an example of the capacitance type MEMS sensor of the present disclosure in the foregoing embodiment, the present invention may be applied to a temperature sensor or a humidity sensor. The diaphragm 20 set forth above can be expanded and contracted depending on the change in temperature and humidity. The capacitance between the diaphragm 20 (the second electrode portion Y) and the sidewall portion 12 facing the diaphragm 20 (the first electrode portion X) is changed in response to the expansion and contraction of the diaphragm 20. It is therefore possible to convert the change in temperature and humidity to an electric signal. Even when the capacitance type MEMS sensor is used as a temperature sensor or a humidity sensor, it is equally possible to provide the same effects as provided by the microphone 1.

While one embodiment has been described, this embodiment has been presented by way of example only, and is not intended to limit the scope of the disclosures. Indeed, the novel sensor described herein may be embodied in a variety of other forms; furthermore, various omissions, substitutions, and changes in the form of the embodiment described herein may be made without departing from the spirit of the disclosures. The accompanying claims and their equivalents are intended to cover such forms or modifications as would fall within the scope and spirit of the disclosures.

What is claimed is:

1. A capacitance type MEMS sensor, comprising:
   a first electrode portion;
   a second electrode portion facing the first electrode portion; and
   a semiconductor substrate having a recess dug in a thickness direction of the semiconductor substrate, the recess having sidewalls being a portion of the semiconductor substrate defining an inner surface of the recess, one of the sidewalls being the first electrode portion;
   wherein the second electrode portion is a diaphragm, the entire diaphragm arranged within the recess to be in parallel with and face the first electrode portion in a posture extending along a depth direction of the recess and to divide an internal space of the recess into a first space positioned at a side of the first electrode portion and a second space positioned at an opposite side of the first electrode portion, the diaphragm having a lower edge spaced apart from a bottom surface of the recess, the diaphragm being made of the same material as the semiconductor substrate; and
   wherein insulating films are arranged at longitudinal opposite sides of the diaphragm to join the longitudinal opposite sides of the diaphragm to the sidewalls other than the sidewall serving as the first electrode portion of the recess, the insulating films being interposed between the diaphragm and the sidewalls, and the insulating films electrically isolating the diaphragm from the semiconductor substrate.

2. The sensor of claim 1, further comprising a cover arranged on the semiconductor substrate to cover at least the first space.

3. The sensor of claim 1, further comprising:
   a cover arranged on the semiconductor substrate to cover the first space and the second space; and
   a bonding agent arranged to join the cover to the semiconductor substrate while leaving an opening through which the second space communicates with a space outside the recess.

4. The sensor of claim 1, further comprising a cover arranged on the semiconductor substrate to cover the first space and the second space, the cover having an opening through which the second space communicates with a space outside the recess.

5. The sensor of claim 1, further comprising a projection protruding toward the first electrode portion from a surface of the diaphragm facing the first electrode portion.

6. The sensor of claim 1, wherein the diaphragm includes an irregularity formed on a surface thereof facing the first electrode portion.

7. The sensor of claim 1, wherein the first electrode portion includes an irregularity formed on a surface thereof.

8. The sensor of claim 7, wherein the diaphragm includes a prominent portion and a depressed portion formed on a surface thereof facing the first electrode portion, the first electrode portion including a prominent portion and a depressed portion formed on a surface thereof facing the diaphragm, the prominent portion of the diaphragm inserted into the depressed portion of the first electrode portion, the prominent portion of the first electrode portion inserted into the depressed portion of the diaphragm.

9. The sensor of claim 1, further comprising an integrated circuit element formed in the semiconductor substrate.

10. The sensor of claim 1, wherein the sensor is a capacitance type microphone that uses the diaphragm as a vibrating plate.

\* \* \* \* \*